(12) United States Patent
Singer et al.

(10) Patent No.: US 10,236,822 B2
(45) Date of Patent: Mar. 19, 2019

(54) METHOD AND APPARATUS FOR CALIBRATING A MICRO-CONCENTRATOR SOLAR ARRAY

(71) Applicant: The Boeing Company, Chicago, IL (US)

(72) Inventors: Scott Benjamin Singer, Sherman Oaks, CA (US); Dimitri D. Krut, Encino, CA (US); Nasser H. Karam, LaCanada, CA (US)

(73) Assignee: The Boeing Company, Chicago, IL (US)

( * ) Notice: Subject to any disclaimer, the term of this patent is extended or adjusted under 35 U.S.C. 154(b) by 429 days.

(21) Appl. No.: 14/656,259

(22) Filed: Mar. 12, 2015

(65) Prior Publication Data

US 2015/0256124 A1   Sep. 10, 2015

Related U.S. Application Data

(63) Continuation-in-part of application No. 14/532,356, filed on Nov. 4, 2014, which is a continuation-in-part of application No. 14/186,703, filed on Feb. 21, 2014.

(51) Int. Cl.
*H02S 20/32* (2014.01)
*H02S 40/22* (2014.01)
*H02S 50/00* (2014.01)
*H01L 31/054* (2014.01)

(52) U.S. Cl.
CPC .......... *H02S 20/32* (2014.12); *H01L 31/0543* (2014.12); *H01L 31/0547* (2014.12); *H02S 40/22* (2014.12); *H02S 50/00* (2013.01); *Y02E 10/52* (2013.01)

(58) Field of Classification Search
CPC ............ G02B 26/0833; G02B 26/0841; G02B 26/085; G02B 6/357; H01L 31/0547; H01L 31/0543
USPC ......... 136/246, 259; 359/199.2, 200.6, 200.8
See application file for complete search history.

(56) References Cited

U.S. PATENT DOCUMENTS

| 412,724 A | 10/1889 | Calver |
|---|---|---|
| 503,004 A | 8/1893 | Severy |
| 629,122 A | 7/1899 | Davis |
| 811,274 A | 1/1906 | Carter |

(Continued)

FOREIGN PATENT DOCUMENTS

| AU | 2015224402 A1 | 5/2016 |
|---|---|---|
| CA | 2878660 A1 | 8/2015 |

(Continued)

OTHER PUBLICATIONS

Final Office Action, dated Jan. 28, 2015, regarding U.S. Appl. No. 12/416,207, 11 pages.

(Continued)

*Primary Examiner* — Susan D Leong
*Assistant Examiner* — Dujuan A Horton
(74) *Attorney, Agent, or Firm* — Yee & Associates, P.C.

(57) ABSTRACT

A method and apparatus for calibrating a reflector in a solar array. A switch device is switched from a first state to a second state. A calibration voltage is applied to each of a set of actuation devices associated with the reflector in response to the switch device switching to the second state when the calibration circuit is electrically connected to the set of actuation devices.

15 Claims, 23 Drawing Sheets

(56) References Cited

U.S. PATENT DOCUMENTS

| | | | |
|---|---|---|---|
| 2,846,724 A | 8/1958 | Aylwin | |
| 2,987,961 A | 6/1961 | Cotton et al. | |
| 3,466,119 A | 9/1969 | Francia | |
| 3,713,727 A | 1/1973 | Markosian et al. | |
| 3,861,379 A | 1/1975 | Anderson, Jr. | |
| 3,905,352 A | 9/1975 | Jahn | |
| 3,964,464 A | 6/1976 | Hockman | |
| 4,034,737 A | 7/1977 | Kume | |
| 4,038,971 A | 8/1977 | Bezborodko | |
| 4,044,753 A | 8/1977 | Fletcher et al. | |
| 4,046,411 A | 9/1977 | Richard, Jr. | |
| 4,106,480 A | 8/1978 | Lyon et al. | |
| 4,110,010 A | 8/1978 | Hilton | |
| 4,198,826 A | 4/1980 | Chromie | |
| 4,235,224 A | 11/1980 | Yarwood et al. | |
| 4,243,019 A | 1/1981 | Severson | |
| 4,249,514 A | 2/1981 | Jones | |
| 4,262,660 A | 4/1981 | Ilich | |
| 4,263,895 A | 4/1981 | Colao | |
| 4,318,393 A | 3/1982 | Goldstein | |
| 4,343,294 A | 8/1982 | Daniel | |
| 4,405,010 A | 9/1983 | Schwartz | |
| 4,463,749 A | 8/1984 | Sobczak et al. | |
| 4,532,916 A | 8/1985 | Aharon | |
| 4,599,995 A | 7/1986 | Dane | |
| 4,784,700 A | 11/1988 | Stern et al. | |
| 4,825,062 A | 4/1989 | Rather et al. | |
| 5,071,243 A | 12/1991 | Bronstein | |
| 5,109,349 A | 4/1992 | Ulich et al. | |
| 5,269,288 A | 12/1993 | Stirbl et al. | |
| 5,325,844 A | 7/1994 | Rogers et al. | |
| 5,862,799 A | 1/1999 | Yogev et al. | |
| 5,979,438 A | 11/1999 | Nakamura | |
| 6,028,689 A | 2/2000 | Michalicek et al. | |
| 6,091,050 A | 7/2000 | Carr | |
| 6,225,551 B1 | 5/2001 | Lewandowski et al. | |
| 6,231,197 B1 | 5/2001 | Nakamura | |
| 6,542,657 B2 | 4/2003 | Anderson | |
| 6,906,848 B2 | 6/2005 | Aubuchon | |
| 6,942,747 B1 | 9/2005 | Wapner et al. | |
| 6,984,050 B2 | 1/2006 | Nakamura | |
| 6,988,809 B2 | 1/2006 | Rabinowitz | |
| 7,133,193 B2 | 11/2006 | Cornwell, Jr. et al. | |
| 7,432,488 B1 | 10/2008 | Hines et al. | |
| 7,567,218 B2 | 7/2009 | Whelan | |
| 7,677,241 B2 | 3/2010 | Hickerson | |
| 7,777,959 B2 | 8/2010 | Sohn et al. | |
| 7,866,836 B2 | 1/2011 | Rabinowitz | |
| 7,905,227 B2 | 3/2011 | Luconi et al. | |
| 8,008,887 B2 | 8/2011 | Lee | |
| 8,071,873 B2 | 12/2011 | Rabinowitz | |
| 8,183,082 B1* | 5/2012 | Lewis | H01L 27/301 |
| | | | 136/263 |
| 8,472,105 B2 | 6/2013 | Zhou | |
| 2004/0027638 A1* | 2/2004 | Wong | G02B 26/0841 |
| | | | 359/280 |
| 2005/0034751 A1 | 2/2005 | Gross et al. | |
| 2005/0157411 A1 | 7/2005 | Rabinowitz | |
| 2005/0229924 A1 | 10/2005 | Luconi et al. | |
| 2006/0038103 A1 | 2/2006 | Helmbrecht | |
| 2006/0201498 A1 | 9/2006 | Olsson et al. | |
| 2006/0231133 A1 | 10/2006 | Fork et al. | |
| 2007/0107769 A1 | 5/2007 | Cobb et al. | |
| 2007/0146741 A1 | 6/2007 | Hillmer et al. | |
| 2007/0236773 A1 | 10/2007 | Pan | |
| 2008/0018975 A1 | 1/2008 | Moidu et al. | |
| 2008/0137172 A1 | 6/2008 | Staker et al. | |
| 2009/0188545 A1 | 7/2009 | Rabinowitz | |
| 2010/0012171 A1 | 1/2010 | Ammar | |
| 2010/0192941 A1 | 8/2010 | Stoia et al. | |
| 2010/0236603 A1 | 9/2010 | Menard et al. | |
| 2010/0326521 A1* | 12/2010 | Rabinowitz | F24J 2/10 |
| | | | 136/259 |
| 2011/0101253 A1 | 5/2011 | Lal et al. | |
| 2012/0031465 A1 | 2/2012 | Battistutti | |
| 2012/0154162 A1 | 6/2012 | Vandevelde et al. | |
| 2012/0266938 A1 | 10/2012 | Goei et al. | |
| 2013/0000696 A1 | 1/2013 | Giri | |
| 2013/0134921 A1 | 5/2013 | Shen et al. | |
| 2014/0078568 A1 | 3/2014 | Lal et al. | |
| 2014/0137924 A1 | 5/2014 | Hollabaugh | |
| 2015/0243819 A1 | 8/2015 | Karam et al. | |
| 2015/0243822 A1 | 8/2015 | Karam et al. | |
| 2015/0244310 A1 | 8/2015 | Singer et al. | |
| 2015/0244316 A1 | 8/2015 | Singer et al. | |

FOREIGN PATENT DOCUMENTS

| | | |
|---|---|---|
| DE | 29615560 U1 | 2/1997 |
| DE | 102008039692 A1 | 3/2010 |
| DE | 102009037083 A1 | 2/2011 |
| DE | 102009039499 A1 | 3/2011 |
| DE | 102011109190 A1 | 2/2013 |
| EP | 2911208 A1 | 8/2015 |
| EP | 3018822 A1 | 5/2016 |
| JP | 2015159713 A | 9/2015 |
| WO | 2008050354 A2 | 5/2008 |
| WO | WO2008115305 A2 | 9/2008 |
| WO | WO2009121174 A1 | 10/2009 |
| WO | WO2009126263 A1 | 10/2009 |
| WO | WO2010065794 A2 | 6/2010 |

OTHER PUBLICATIONS

Office Action, dated Jun. 18, 2015, regarding U.S. Appl. No. 12/416,207, 14 pages.
Office Action, dated Nov. 3, 2015, regarding U.S. Appl. No. 14/186,703, 21 pages.
Office Action, dated Nov. 6, 2015, regarding U.S. Appl. No. 14/532,356, 30 pages.
Extended European Search Report, dated Jun. 29, 201, regarding Application No. EP15150912.2, 6 pages.
Extended European Search Report, dated Mar. 23, 2016, regarding Application No. EP15183173.2, 8 pages.
Final Office Action, dated Apr. 22, 2016, regarding U.S. Appl. No. 14/532,356, 26 pages.
Office Action, dated Jul. 15, 2016, regarding U.S. Appl. No. 14/656,303, 40 pages.
Extended European Search Report, dated Jun. 29, 2016, regarding Application No. EP16153321.12, 7 pages.
Office Action, dated Oct. 7, 2016, regarding U.S. Appl. No. 14/532,536, 21 pages.
Final Office Action, dated Dec. 20, 2016, regarding U.S. Appl. No. 14/656,303, 18 pages.
"Office Action," dated Aug. 27, 2014, regarding U.S. Appl. No. 12/416,207, 13 pages.
"Office Action," dated Oct. 21, 2011, regarding U.S. Appl. No. 12/416,207, 14 pages.
"Office Action," dated May 15, 2013, regarding U.S. Appl. No. 12/416,207, 11 pages.
"Office Action," dated Dec. 20, 2013, regarding U.S. Appl. No. 12/416,207, 4 pages.
"Office Action," dated Jan. 17, 2014, regarding U.S. Appl. No. 12/416,207, 13 pages.
Legtenberg et al., "Comb-drive actuators for large displacements," IOP Publishing Ltd., Jun. 1996, pp. 320-329.
"DLP Projectors: DLP low maintenance, filter-free projectors," Texas Instruments Incorporated, copyright 2009, 4 pages.
"Mirrorcle Technologies MEMS Mirrors—Technical Overview," Mirrorcle Technologies, Inc., copyright 2009-2013, 6 pages.
Hah et al., "Low-Votage, Large-Scan Angle MEMS Analog Micromirror Arrays With Hidden Vertical Comb-Drive Actuators," Journal of Microelectromechanical Systems, vol. 13, No. 2, Apr. 2004, pp. 279-289.
Karam et al., "Micro-Concentrator Solar Array Using Micro-Electromechanical Systems (MEMS) Based Reflectors," U.S. Appl. No. 14/186,703, filed Feb. 21, 2014, 20 pages.

(56) References Cited

OTHER PUBLICATIONS

Singer et al., "Micro-Concentrator Solar Array Using Micro-Electromechanical Systems (MEMS) Based Reflectors," U.S. Appl. No. 14/532,356, filed Nov. 4, 2014, 53 pages.
Notice of Allowance, dated Jun. 21, 2017, regarding U.S. Appl. No. 14/656,303, 14 pages.
Final Office Action, dated Apr. 22, 2016, regarding U.S. Appl. No. 14/186,703, 17 pages.
Office Action, dated Aug. 25, 2016, regarding U.S. Appl. No. 14/186,703, 17 pages.
Final Office Action, dated Jan. 27, 2017, regarding U.S. Appl. No. 14/186,703, 19 pages.
Final Office Action, dated Mar. 21, 2017, regarding U.S. Appl. No. 14/532,356, 16 pages.
Office Action, dated Nov. 3, 2016, regarding U.S. Appl. No. 14/534,261, 14 pages.
European Search Report, dated Jun. 17, 2016, regarding Application No. EP16153318.7, 2 pages.
Canadian Intellectual Property Office Examination Search Report, dated Sep. 5, 2018, regarding Application No. 2,904,561, 13 pages.
Notice of Allowance, dated Aug. 10, 2018, regarding U.S. Appl. No. 14/532,356, 12 pages.

\* cited by examiner

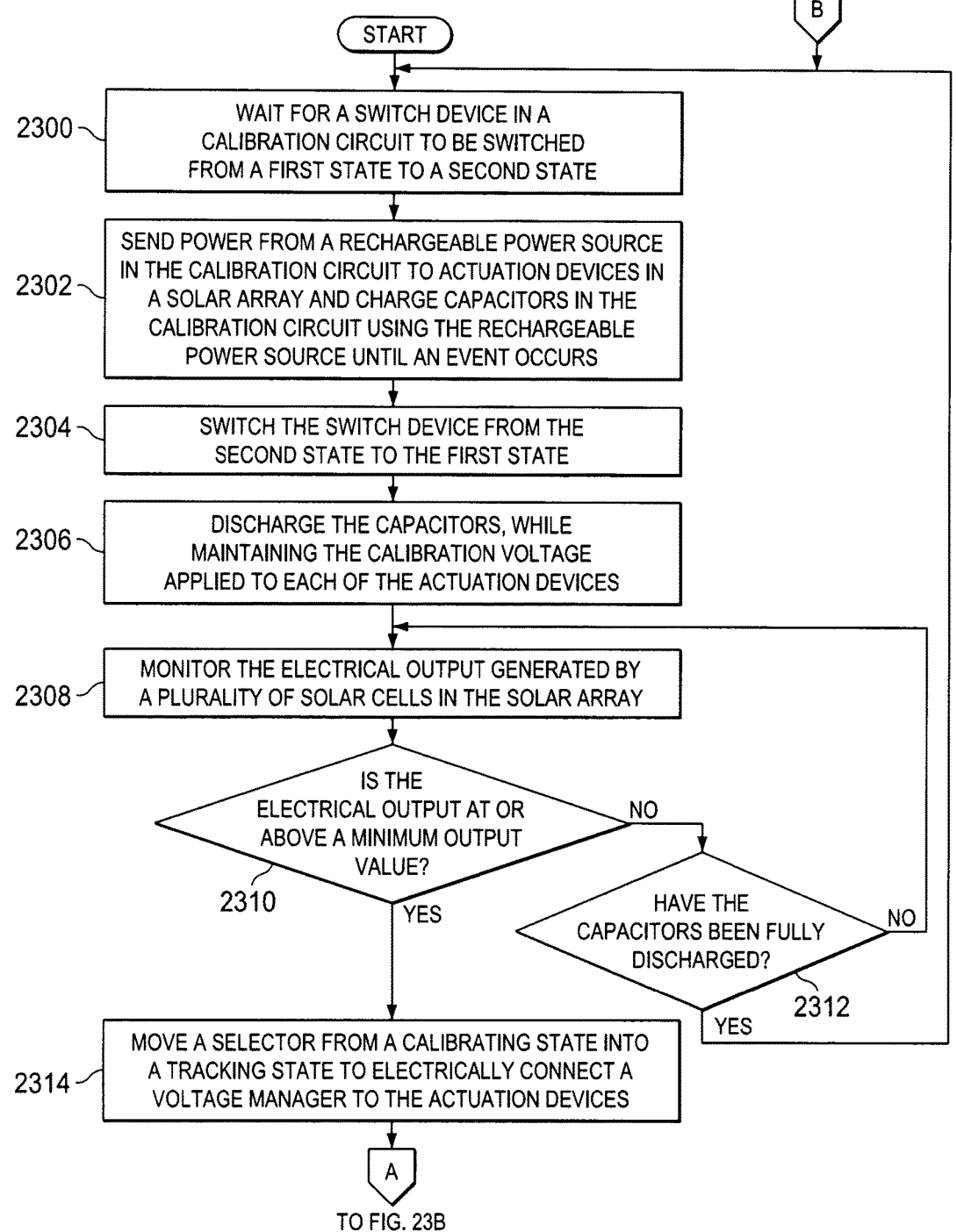

METHOD AND APPARATUS FOR CALIBRATING A MICRO-CONCENTRATOR SOLAR ARRAY

CROSS-REFERENCE TO RELATED APPLICATIONS

This application is a continuation-in-part of prior U.S. patent application Ser. No. 14/532,356, filed Nov. 4, 2014, and entitled "Micro-Concentrator Solar Array Using Micro-Electromechanical Systems (MEMS) Based Reflectors," which is a continuation-in-part of prior U.S. patent application Ser. No. 14/186,703, filed Feb. 21, 2014, and entitled "Micro-Concentrator Solar Array Using Micro-Electromechanical Systems (MEMS) Based Reflectors." Further, this application is related to U.S. patent application Ser. No. 14/656,303, which issued as U.S. Pat. No. 9,813,022, filed Mar. 12, 2015, and entitled, "Dynamically Setting a Threshold Output Level for a Solar Array."

BACKGROUND INFORMATION

1. Field

The disclosed system and method relate to a micro-concentrator solar array and, more particularly, to a method and apparatus for dynamically setting a selected threshold for the electrical output generated by the solar cells in a solar array.

2. Background

Electric power generation from solar or photovoltaic cells has experienced significant interest recently. Solar cells convert light energy, typically from the sun, into electrical energy. The light intensity on a solar cell may be referred to as the number of suns, where a 1-sun concentration corresponds to standard illumination at 1 kW/m2.

Widespread adoption of solar cells for power generation may require further breakthrough in both cost and efficiency. For example, many solar power generators currently available employ flat-plate technologies, where the solar cells operate under 1-sun concentration. These types of solar power generators have relatively low solar-to-power conversion efficiencies, are relatively large and cumbersome, and tend to transform a majority of light energy into heat. Moreover, these solar power generators may result in relatively long charge times in practice. Specifically, sometimes charging equipment using the solar power generator may take many hours, even over several days. In addition to the long charge times, the position of the solar power generators needs to be adjusted periodically during the day in order to accommodate the changing position of the sun in the sky. Therefore, it would be desirable to have a method and apparatus that take into account at least some of the issues discussed above, as well as other possible issues.

SUMMARY

In one illustrative example, an apparatus comprises a set of actuation devices and a calibration circuit. The set of actuation devices is associated with a reflector in a solar array. The calibration circuit comprises a switch device operable to switch between a first state and a second state. Switching the switch device from the first state to the second state applies a calibration voltage to each of the set of actuation devices when the calibration circuit is electrically connected to the set of actuation devices.

In another illustrative example, a solar array comprises a plurality of reflectors, a plurality of actuation devices associated with the plurality of reflectors, a plurality of solar cells that generate an electrical output, a calibration circuit, and a selector. The calibration circuit comprises a switch device operable to switch between a first state and a second state. Switching the switch device from the first state to the second state causes the calibration circuit to apply a calibration voltage to each of the set of actuation devices when the calibration circuit is electrically connected to the set of actuation devices. The selector electrically connects the calibration circuit to the plurality of actuation devices when the selector is in a calibrating state and electrically disconnects the calibration circuit from the plurality of actuation devices when the selector is in a tracking state.

In yet another illustrative example, a method is provided for calibrating a reflector in a solar array. A switch device is switched from a first state to a second state. A calibration voltage is applied to each of a set of actuation devices associated with the reflector in response to the switch device switching to the second state when the calibration circuit is electrically connected to the set of actuation devices.

The features and functions can be achieved independently in various aspects of the present disclosure or may be combined in yet other aspects in which further details can be seen with reference to the following description and drawings.

BRIEF DESCRIPTION OF THE DRAWINGS

The novel features believed characteristic of the illustrative examples are set forth in the appended claims. The illustrative examples, however, as well as a preferred mode of use, further objectives and advantages thereof, will best be understood by reference to the following detailed description of an illustrative examples of the present disclosure when read in conjunction with the accompanying drawings, wherein:

FIGS. 23A and 23B are illustrations of a process for managing the reflectors in a solar array in the form of a flowchart in accordance with an illustrative example.

DETAILED DESCRIPTION

Figure 1:
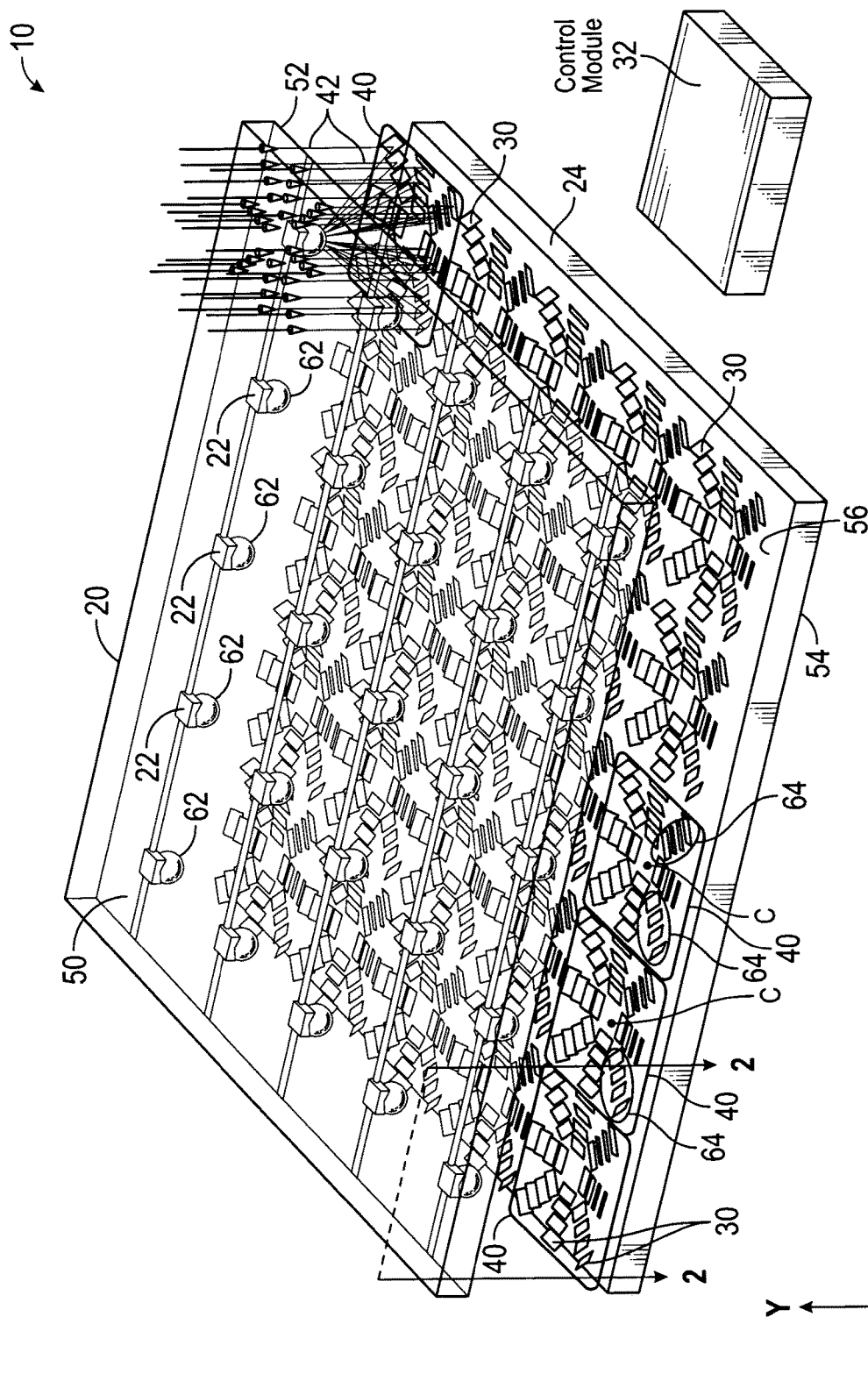
FIG. 1 is an illustration of the disclosed micro-concentrator solar array including a plurality of solar cells arranged on a coverglass and a plurality of micro-electromechanical systems (MEMS) based reflectors arranged on a substrate.

As shown in FIG. 1, the micro-concentrator solar array 10 according to an aspect of the disclosure may include a coverglass 20, a plurality of solar cells 22, a substrate 24, a plurality of micro-electromechanical systems (MEMS) based mirrors or reflectors 30, and a control module 32. In the exemplary aspect as shown, the solar cells 22 may be arranged in a 5×5 array upon the coverglass 20, which results in a total of twenty-five solar cells 22 included within the micro-concentrator solar array 10. However, those skilled in the art will appreciate that the micro-concentrator solar array 10 may include any number of solar cells 22. An array 40 of reflectors 30 may be associated with each solar cell 22. Each reflector 30 included within the array 40 may be positioned relative to the associated solar cell 22 in order to focus or reflect a plurality of light beams 42 generated by a light source (not illustrated) onto the solar cell 22.

The light source may be any type of radiating energy source such as, for example, man-made lighting in a building, or the sun. Each reflector 30 may be selectively tiltable such that if the position of the light source changes, each reflector 30 located within the associated array 40 may be tilted accordingly in order to track the changed position of the light source relative to the associated solar cell 22. For example, if the light source is the sun, then each reflector 30 located within the associated array 40 may be tilted accordingly in order to track the changing position of the sun throughout the day. The tilting of the reflectors 30 relative to the light source is described in greater detailed below.

The micro-concentrator solar array 10 may be used in any application where light energy, typically from the sun, may be converted into electrical energy. For example, FIG. 1 illustrates a single micro-concentrator solar array 10 for purposes of convenience and clarity. The single micro-concentrator solar array 10 in FIG. 1 may be used in relatively compact applications such as, for example, a slim-line pocket-sized portable power generator. However, the single micro-concentrator solar array 10 may be electrically connected or ganged with other micro-concentrator solar arrays in order to create a two-dimensional or tiled array of multiple micro-concentrator arrays (not illustrated). The two-dimensional array of multiple micro-concentrator arrays may be used in relatively large-scale applications such as, for example, a terrestrial portable power generator, an unmanned aerial vehicle (UAV), or a satellite.

The coverglass 20 may be constructed of any transparent material that allows for the light beams 42 to pass through such as, for example, glass, plastic, or silicon dioxide. The substrate 24 may be used to support or mount the reflectors 30. In one non-limiting aspect, the substrate 24 may be constructed of fused silica.

Figure 2:
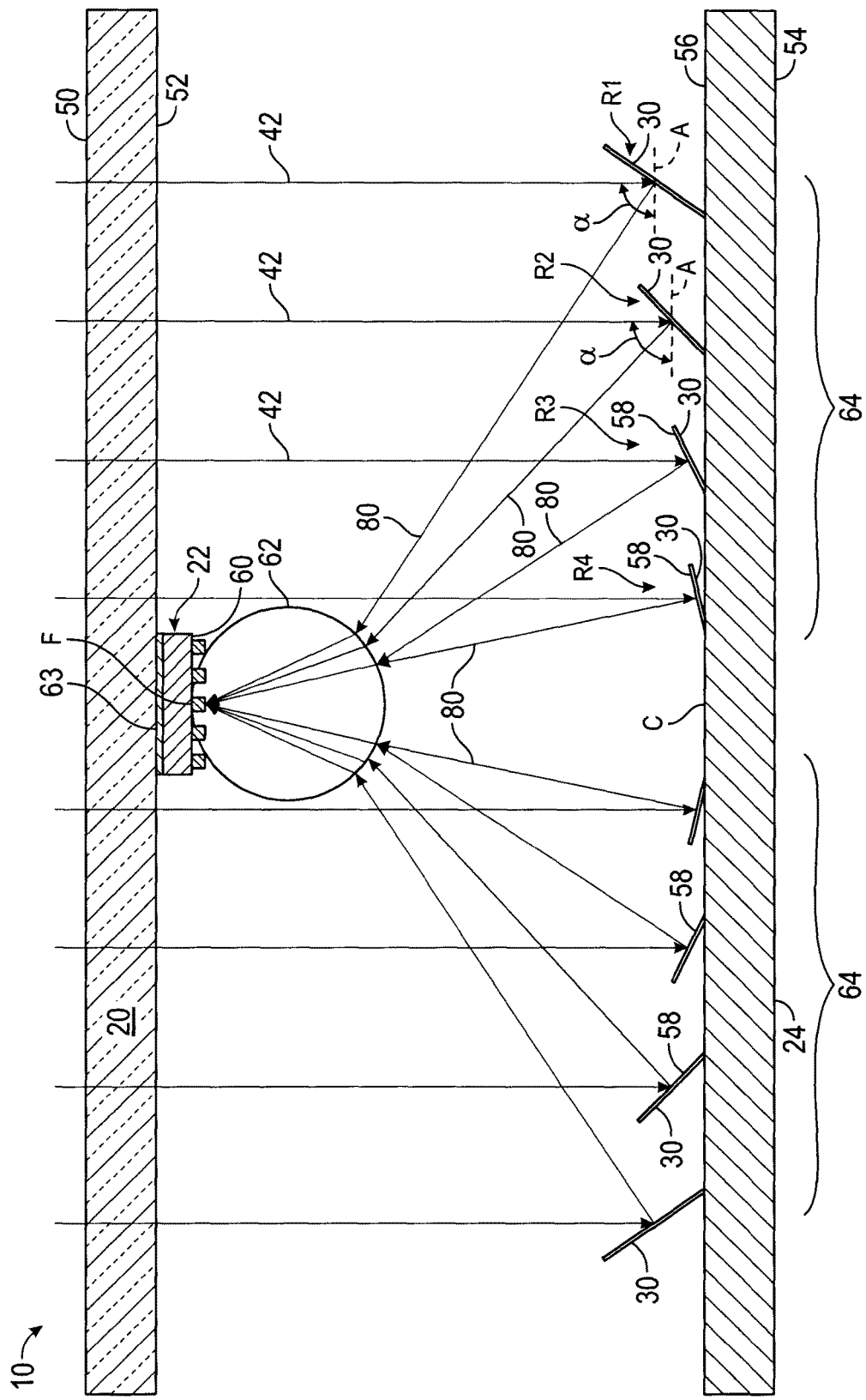
FIG. 2 is a cross-section of the micro-concentrator solar array taken along section line 2-2 in FIG. 1.

FIG. 2 is a cross-section of a portion of the coverglass 20, a single solar cell 22, the substrate 24, and the reflectors 30 associated with the single solar cell 22, taken along section line 2-2 in FIG. 1. Referring generally to FIGS. 1-2, the coverglass 20 may include an outer surface 50 and an inner surface 52, and the substrate 24 may also include an outer surface 54 and an inner surface 56. In one aspect, an optional anti-reflection coating may be applied to the inner and outer surfaces 52, 50, of the coverglass 20. The inner surface 52 of the coverglass 20 generally opposes the inner surface 56 of the substrate 24. Each solar cell 22 may include a front surface 60 and a back surface 63 (seen in FIG. 2). The back surface 63 of the solar cell 22 may be affixed to or carried by the inner surface 52 of the coverglass 20.

Although FIGS. 1-2 show the coverglass 20 located above the substrate 24, it is to be understood that this illustration is merely exemplary in nature. Those skilled in the art will appreciate that the coverglass 20 may be located relative to the substrate 24 in any position where the light beams 42 may be directed upon the reflectors 30 and onto the solar cells 22. For example, in another aspect, the micro-concentrator solar array 10 may be rotated by ninety degrees, and the coverglass 20 may be located to the right of the substrate 24. Moreover, in some aspects the coverglass 20 may be omitted. Instead, the solar cells 22 may be mounted on a corresponding support member 320 shown in FIG. 5, and is described in greater detail below.

Referring to FIG. 1, in one aspect, the reflectors 30 may be arranged in a two-dimensional pattern upon the inner surface 56 of the substrate 24. Specifically, each array 40 may include multiple sub-arrays 64 of reflectors 30. In the aspect as shown in FIG. 1, each sub-array 64 may include four reflectors 30, however, it is to be understood that any number of reflectors 30 may be included within the sub-array 64 as well. In the non-limiting aspect as shown in FIG. 1, each sub-array 64 of reflectors 30 may be arranged in a radially outward direction with respect to a central point C of the array 40. The specific solar cell 22 associated with the array 40 may be positioned along the inner surface 52 of the coverglass 20 to generally oppose the central point C. Although FIG. 1 illustrates each sub-array 64 of reflectors 30 arranged in a radially outward direction, those skilled in the art will appreciate that this illustration is merely exemplary in nature. For example, in another aspect, the reflectors 30 may be arranged in a rectangular pattern.

The solar cells 22 may also be referred to as photovoltaic cells. The solar cells 22 may be any device configured to convert solar radiation into electrical energy. In one exemplary aspect, the micro-concentrator solar array 10 may include a secondary optical device 62 associated with each solar cell 22. However, it is to be understood that the secondary optical device 62 may be omitted in some aspects. Referring to FIG. 2, the secondary optical device 62 may be positioned along the front surface 60 of the solar cell 22. The secondary optical device 62 may be used to focus the light beams 42 reflected off of each reflection surface 58 of the reflectors 30 and onto a focal point F located on the solar cell 22. Thus, the solar cell 22 may receive an increased amount of light energy if the secondary optical device 62 is included. The secondary optical device 62 may be any type of concentrator or lens for focusing light from the reflectors 30 onto the focal point F of the solar cell 22 such as, for example, a concave lens, a convex lens, a parabolic lens, or a Fresnel lens.

Figure 3:
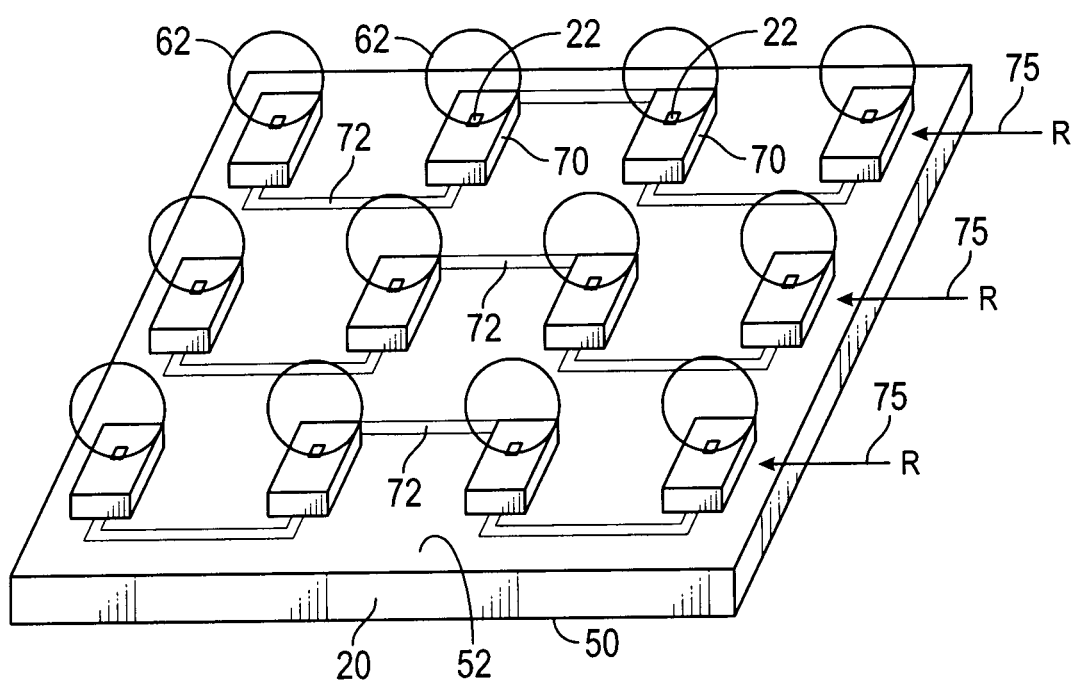
FIG. 3 is a perspective view of a portion of the coverglass shown in FIG. 1, where receivers may be used to mount the solar cells to the coverglass.

FIG. 3 illustrates a portion of the inner surface 52 of the coverglass 20, where the coverglass 20 has been rotated one hundred and eighty degrees such that the inner surface 52 of the coverglass 20 is facing upwardly. In the aspect as shown in FIG. 3, the solar cells 22 are each mounted to and electrically connected to a corresponding receiver 70. Each receiver 70 may be mounted to the inner surface 52 of the coverglass 20. The receivers 70 may be used as an alternative approach for mounting the solar cells 22 to the coverglass 20. In one aspect, the receivers 70 may include a heat sink or other device (not illustrated) for dissipating heat generated by the solar cell 22.

A plurality of interconnects 72 may be used to electrically connect two or more of the receivers 70 to one another. In one aspect, the interconnects 72 may be constructed from an electrically conductive material such as, for example, metal. The interconnects 72 may be located along the inner surface 52 of the coverglass 20, and may be used to electrically connect the receivers 70 in any number of configurations in order to provide the voltage and current required for a specific application. For example, in the aspect as shown in FIG. 3, the interconnects 72 may be used to connect the receivers 70 located in a single row 75 to one another in a series configuration. However, the interconnects 72 may also be used to connect each row 75 of receivers 70 to one another in a parallel configuration (the parallel connection is not illustrated in FIG. 3). Although FIG. 3 illustrates the receivers 70 located in each row 75 connected to one another in a series configuration, it is to be understood that the receivers 70 may be connected to one another in a parallel configuration as well. Moreover, although each row 75 of receivers 70 is described as being connected to one another in a parallel configuration, it is to be understood that the rows 75 of receivers 70 may be connected together in a series configuration as well.

Referring to FIG. 2, the reflectors 30 may be any type of MEMS-based device having an elliptical, cylindrical, rectangular, square, or randomly shaped micro-mirror or micro-reflector configured to reflect light. An actuation device (not illustrated) may be provided for each reflector 30. The actuation device may be used to adjust an amount of tilt of an associated reflector 30. Specifically, as seen in FIG. 2, the amount of tilt of each reflector may be measured by an angle α. The angle α may be measured between the reflection surface 58 of the reflector 30 and an axis A-A. The axis A-A may be oriented generally parallel with respect to the substrate 24. A reflected light beam 80 may represent the light reflected off of the reflection surface 58 of the reflector 30 and directed towards the secondary optical device 62. If the secondary optical device 62 is omitted, then the reflected light beam 80 may be directed towards the focal point F located on the solar cell 22. It should be noted that while the reflector 30 is described as being tiltable or rotatable in the x-axis direction (the x-axis is illustrated in FIG. 1), the reflector 30 may be tilted about a second axis of rotation as well. Specifically, in one aspect, the angle α of the reflector 30 may be tilted in the z-axis direction (the z-axis is illustrated in FIG. 1) as well. Thus, the reflector 30 may be tilted using either single-axis tracking (i.e., adjusted in either the x-axis or the z-axis) or dual-axis tracking (i.e., adjusted in both the x-axis and the z-axis). In other words, the reflectors may be tiltable or rotatable about either one axis of rotation or two axes of rotation.

The actuation device (not illustrated) may be any type of device capable of adjusting the angle α of the associated reflector 30. For example, in one non-limiting aspect, the actuating devices may be comb-drive actuators that use static electromagnetic potential for actuation. In another aspect, the actuating devices may be a rotational actuator. One commercially available example of the rotational actuator is the 4-quadrant 2-axis actuators manufactured by Mirrorcle Technologies of Richmond, Calif.

Referring to both FIGS. 1-2, the angle α of the reflectors 30 may be adjusted by applying a specific or unique amount of voltage to each of the actuation devices (not illustrated). For example, with reference to FIG. 2, the reflector R1 located to the far right may be tilted at a different angle α when compared to the angles α of the remaining reflectors R2, R3, and R4 located within the sub-array 64. Each reflector 30 may be tilted at a different angle α based on the reflector's 30 position relative to the focal point F of the corresponding solar cell 22. Thus, a unique amount of voltage may be applied to the actuation device associated with each reflector 30 in order to tilt each reflector 30 by a specific amount.

In one approach, the control module 32 may have a voltage-tilt curve stored in memory. In one aspect, the voltage-tilt curve may be stored in memory as either a lookup table or a polynomial fit to voltage-tilt data. The voltage-tilt curve may include a plurality of unique voltage values that are each associated with different values of the angle α of the reflector 30. It should be noted that the voltage-tilt curve may be common to all of the reflectors 30 located within the micro-concentrator solar array 10. The memory of the control module 32 may also store the position of all of the reflectors 30 relative to the corresponding solar cell 22 as well.

The control module 32 may determine the unique amount of voltage applied to each reflector 30 using the following approach. First, the control module 32 may calculate the angle α of the reflectors 30. In the example as described, the control module 32 calculates the angle α of the reflector R1 to the far right as shown in FIG. 2. The control module 32 may calculate the angle α of the reflector R1 based on the position of the reflector R1 relative to the corresponding solar cell 22 (stored in memory of the control module 32), and an angle θ of the light beams 42. The angle θ of the light beams 42 may be measured with respect to the coverglass 20. The angle θ of the light beams 42 may be a known value stored in memory of the control module 32. The value of the angle θ of the light beams 42 stored in memory may be updated as the position of a light source (e.g., the sun) changes. Once the control module 32 calculates the angle α of the reflector R1, the control module 32 may then obtain the unique amount of voltage applied to the reflector R1 using the voltage tilt-curve. For example, if the control module 32 determines that the angle α of the reflector R1 should be fifteen degrees, then the control module 32 obtains the unique amount of voltage associated with an angle of fifteen degrees from the voltage-tilt curve stored in memory of the control module 32. Finally, the control module 32 may apply the unique amount of voltage obtained from the voltage-tilt curve to the actuation device associated with the reflector R1.

Referring to FIGS. 1-3, the control module 32 may refer to, or be part of, an application specific integrated circuit (ASIC), an electronic circuit, a combinational logic circuit, a field programmable gate array (FPGA), a processor (shared, dedicated, or group) that executes code, or a combination of some or all of the above, such as in a system-on-chip. The control module 32 may be in operative communication with each of the solar cells 22 and the reflectors 30. Specifically, the control module 32 may be in communication with all of the solar cells 22 located within the micro-concentrator solar array 10 through the interconnects 72 located along the coverglass 20 shown in FIG. 3 (the connection between the interconnects 72 and the control module 32 is not illustrated in the figures).

The control module 32 may include control logic for monitoring the electrical output generated by all of the solar cells 22 located within the micro-concentrator solar array 10. The electrical output measured by the control module 32 may be, for example, voltage, current, or power generated by the solar cells 22. The control module 32 may monitor the electrical output generated by all of the solar cells 22 located within the micro-concentrator solar array 10 at a predetermined time interval. The predetermined time interval may be any set amount of time such as, for example, every thirty seconds, every minute, or every five minutes.

In the illustration as shown in FIG. 2, the reflectors 30 are tilted at their ideal angles α such that the reflected light beams 80 are each directed towards the focal point F located on the solar cell 22. The control module 32 may store an ideal output value within memory. The ideal output value represents the electrical output of the solar cells 22 (e.g., voltage, current, power, etc.) when the reflectors 30 are tilted at their ideal angles. FIG. 2 illustrates the light source (e.g., the sun) directing the light beams 42 in a direction generally perpendicular to the coverglass 20 and the substrate 24. However, as the sun moves throughout the sky throughout the day, the direction of the light beams 42 changes accordingly. Thus, the position of the reflected light beams 80 reflected off of the reflection surface 58 of each reflector 30 may also change. As a result, the reflected light beams 80 are eventually reflected away from the focal point F of the corresponding solar cell 22. Focusing light upon the focal point F of a corresponding solar cell 22 may maximize the amount of electrical output generated by the solar cell 22. As the reflected light beams 80 are directed away from the focal point F of the corresponding solar cell 22, less light energy may be received by the solar cell 22. As a result, the electrical output generated by the solar cell 22 is decreased.

Referring to FIGS. 1-2, the control module 32 monitors the electrical output generated by all of the solar cells 22 located within the micro-concentrator solar array 10 at the predetermined time interval. The control module 32 also includes control logic for comparing the electrical output generated by the solar cells 22 with a threshold value. The threshold value may represent an electrical output generated by all of the solar cells 22 that is less than the ideal output value. For example, in one non-limiting aspect, the threshold value may be about ninety-five percent of the ideal output value.

The control module 32 may include circuitry or control logic for applying the unique amount of voltage to each of the actuation devices (not illustrated) associated with the reflectors 30 if the electrical output generated by all of the solar cells 22 is below the threshold value. Specifically, once the electrical output generated by the solar cells 22 drops below a threshold value, then the control module 32 may apply the unique amount of voltage to each of the actuation devices (not illustrated). The reflectors 30 may be repositioned such that the reflected light beams 80 reflected off of the reflection surface 58 of each reflector 30 may be directed back towards the focal point F of the corresponding solar cell 22. In one aspect, the control module 32 may include control logic for re-positioning the reflectors 30 towards the focal point F of the corresponding solar cell 22 by first stepping through a plurality of pre-programmed reflector positions stored in memory. Each pre-programmed reflector position corresponds with a specific position of the light source. For example, if the light source is the sun, then each pre-programmed reflector position stored in memory of the control module 32 may correspond with the different positions of the sun in the sky. The control module 32 may step though the pre-programmed reflector positions until the reflectors 30 align and focus the light beams 80 towards the focal point F of the solar cell 22.

Figure 4:
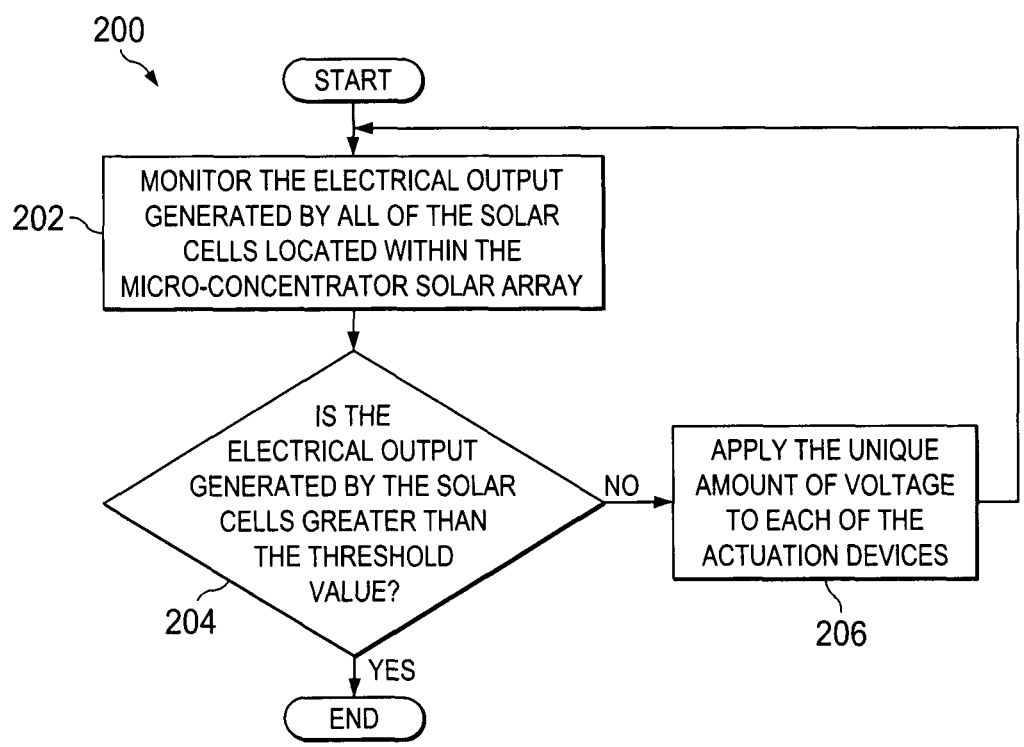
FIG. 4 is an exemplary process flow diagram illustrating a method of adjusting the reflectors shown in FIG. 1.

FIG. 4 is a process flow diagram illustrating an exemplary method 200 of adjusting the tilt of the reflectors 30. Referring generally to FIGS. 1-4, method 200 may begin at block 202, where the control module 32 monitors the electrical output generated by all of the solar cells 22 located within the micro-concentrator solar array 10. The electrical output measured by the control module 32 may be, for example, voltage, current, or power generated by the solar cells 22. Method 200 may then proceed to block 204.

In block 204, the control module 32 compares the electrical output generated by all of the solar cells 22 located within the micro-concentrator solar array 10 with the threshold value. If the electrical output is equal to or greater than the threshold value, then method 200 may then terminate. However, if the electrical output is less than the threshold value, then method 200 may proceed to block 206.

In block 206, the control module 32 may apply the unique amount of voltage to each of the actuation devices (not illustrated). As discussed above, applying the unique amount of voltage to each of the actuation devices may re-position each of the reflectors 30 such that the reflected light beams 80 reflected off of the reflection surface 58 of each reflector 30 may be directed back towards the focal point F of the corresponding solar cell 22. Method 200 may then return to block 202.

Figure 5:
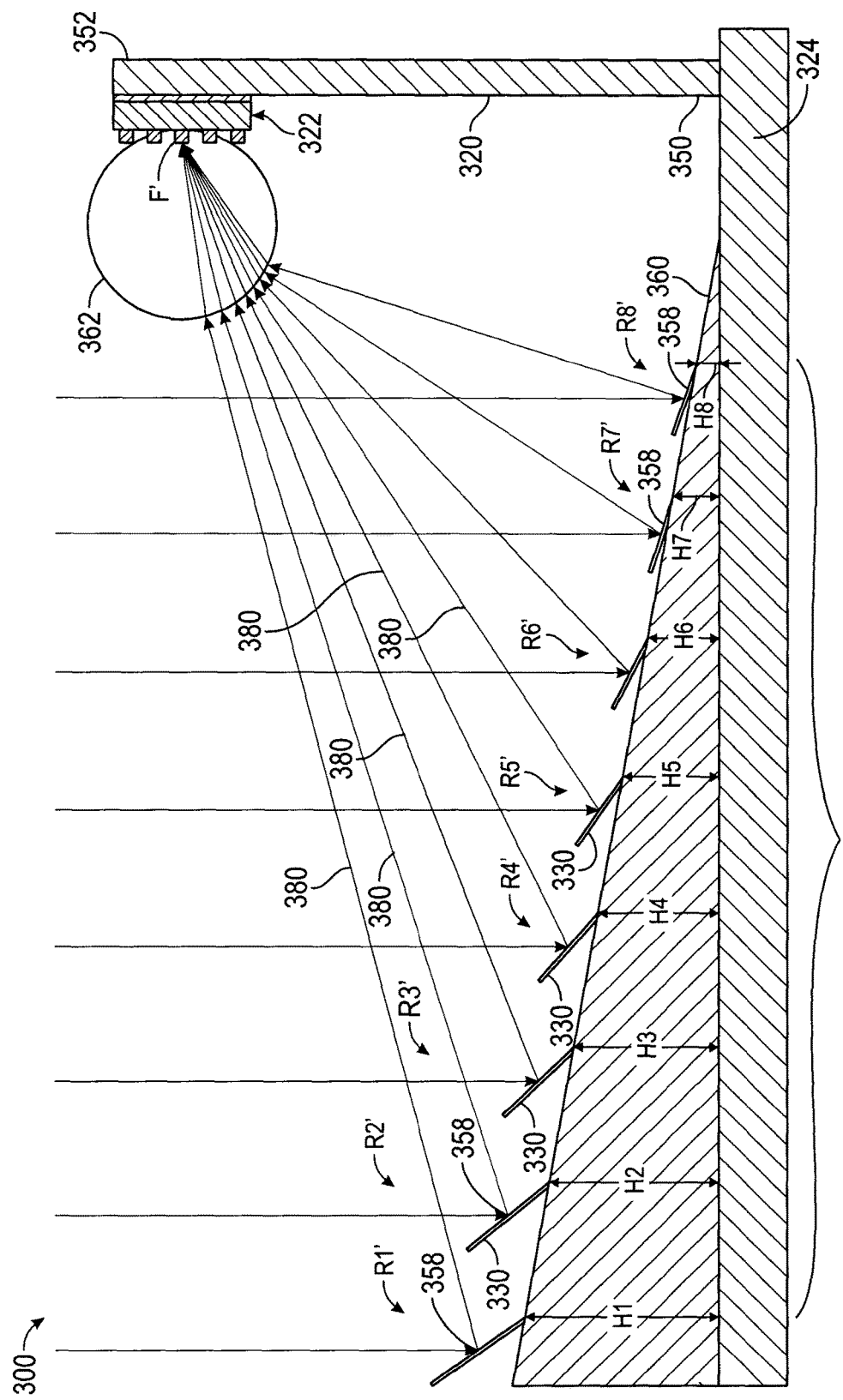
FIG. 5 is an illustration of an alternative aspect of the micro-concentrator solar array.

FIG. 5 is a cross-section of an alternative aspect of a micro-concentrator solar array 300, illustrating a single solar cell 322 and a sub-array 364 of reflectors 330 associated with the solar cell 322. In the aspect as shown in FIG. 5, the reflectors 330 may be supported by a substrate 324. A corresponding support member 320 may be attached or otherwise affixed to the substrate 324. Specifically, the support member 320 includes a first end 350 and a second end 352. The first end 350 of the support member 320 may be affixed to the substrate 324. The solar cell 322 may be affixed to the second end 352 of the support member 320. It should be noted that the aspect as shown in FIG. 5 does not require a coverglass, and instead the support member 320 may be used to carry the solar cell 322. Although FIG. 5 illustrates a single solar cell 322, those skilled in the art will appreciate that the solar cell 322 may be part of an array of multiple solar cells. For example, the substrate 324 may include multiple support members 320. Each support member 320 may carry a solar cell 322. Also, while FIG. 5 illustrates a single sub-array 364 of the reflectors 330, it is to be understood that multiple sub-arrays 364 of reflectors 330 may surround the solar cell 322.

The substrate 324 may include a ramped or inclined inner surface 360. The reflectors 330 may be positioned along the inner surface 360 of the substrate 324. In the non-limiting aspect as shown, the sub-array 364 includes eight reflectors R1'-R8', where the reflector R1' may be the reflector 330 located the furthest away from the solar cell 322, and the reflector R8' may be the reflector 330 located closest to the solar cell 322. The inner surface 360 of the substrate 324 may be angled such that the reflector R1' may be positioned at a vertical height H1, the reflector R2' may be positioned at a vertical height H2, and the remaining reflectors R3'-R8' may be positioned accordingly.

The vertical heights H1-H8 of the reflectors R1'-R8' may be graduated accordingly such that light reflected off of one of the reflectors 330 in the sub-array 364 does not generally interfere with another reflector 330 located downstream. For example, the vertical height H1 of the reflector R1' is greater than the vertical heights of the remaining reflectors R2'-R8'. Thus, the reflector R1' may be elevated such that a beam of light 380 reflected off a reflection surface 358 of the reflector R1' does not interfere or intersect with any of the remaining reflectors R2'-R8' located within the sub-array 364. Instead, the beam of light 380 reflected off the reflection surface 358 may be directed towards a secondary optical device 362 and onto a focal point F' located on the solar cell 322.

Referring generally to FIGS. 1-5, the disclosed micro-concentrator solar array 10 provides a relatively compact and efficient approach for converting light into electrical energy. In particular, the disclosed micro-concentrator solar array 10 provides an approach for adjusting the MEMS based reflectors (e.g., the reflectors 30 shown in FIGS. 1-3 or the reflectors 330 shown in FIG. 5) based on the position of a moving light source (not illustrated). For example, if the light source is the sun, the reflectors may track the position of the sun throughout the sky. The reflectors may then reflect the light from the sun onto the focal point of a corresponding solar cell. Therefore, if the micro-concentrator solar array 10 is part of a solar power generator, then a user does not generally need to re-position the solar power generator periodically during the day in order to accommodate the changing position of the sun within the sky. Moreover, many solar power generators currently available employ flat-plate technologies, where the solar cells operate under 1-sun concentration. In contrast, the disclosed micro-concentrator solar array 10 uses the reflectors in order to concentrate light onto the solar cells. In one aspect, the disclosed solar cells may operate between about 5-suns to about 500-suns concentration. Thus, the disclosed micro-concentrator solar array 10 may employ smaller solar cells that require less space. The disclosed micro-concentrator solar array 10 may also provide higher solar-to-power conversion efficiencies, and transform less of light energy into heat when compared to the technologies currently available. While the forms of apparatus and methods herein described constitute preferred aspects of this invention, it is to be understood that the invention is not limited to these precise forms of apparatus and methods, and the changes may be made therein without departing from the scope of the invention.

The illustrative examples recognize and take into account that it may be desirable to have a method and apparatus for controlling a solar array to ensure that the highest concentrations of light are focused onto the solar cells of the solar array at substantially all times. In particular, it may be desirable to have a method and apparatus for ensuring that the solar cells of a solar array generate an electrical output that is at least at a selected threshold or threshold value.

Figure 6:
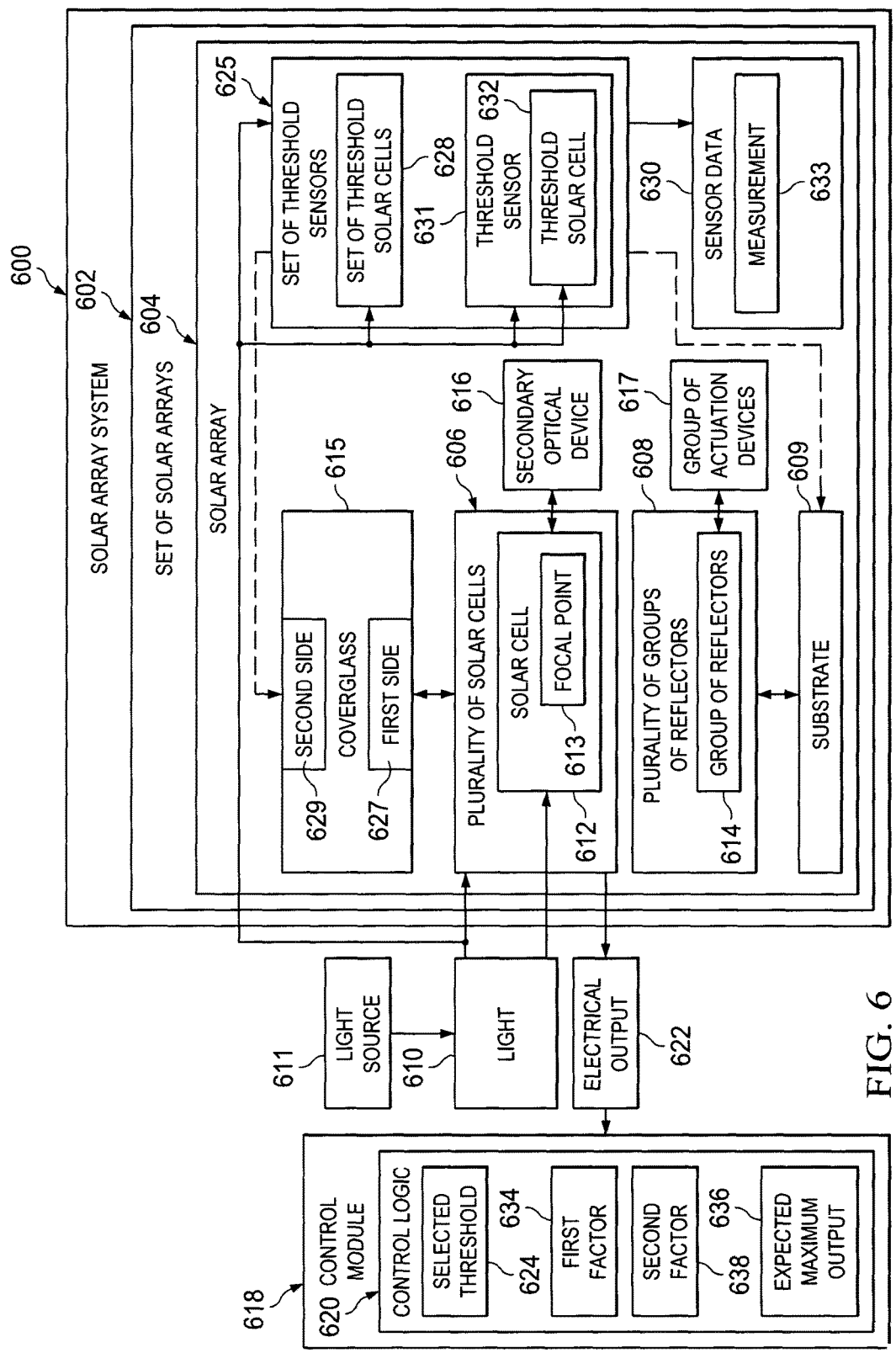
FIG. 6 is an illustration of a solar array system in the form of a block diagram in accordance with an illustrative example.

Referring now to FIG. 6, an illustration of a solar array system is depicted in the form of a block diagram in accordance with an illustrative example. In this illustrative example, solar array system 600 is depicted. Solar array system 600 may be comprised of set of solar arrays 602. As used herein, a "set of" items may include one or more items.

In some illustrative examples, each of set of solar arrays 602 may be referred to as a micro-concentrator solar array. In other illustrative examples, each of set of solar arrays 602 may be referred to as a solar panel. In these cases, solar array system 600 may be referred to as a solar panel system. For example, solar array 604 may be an example of one of set of solar arrays 602. Solar array 604 may be referred to as a micro-concentrator solar array. Micro-concentrator solar array 10 in FIG. 1 may be an example of one implementation for solar array 604.

As depicted, solar array 604 may be comprised of plurality of solar cells 606 and plurality of groups of reflectors 608. Plurality of groups of reflectors 608 may be supported by substrate 609. In some illustrative examples, control electronics may be integrated into substrate 609 for controlling plurality of groups of reflectors 608. These control electronics may be used to control actuation devices associated with the reflectors in plurality of groups of reflectors 608.

As used herein, when one component is "associated" with another component, the association is a physical association in the depicted examples. For example, a first component, such as an actuation device, may be considered to be associated with a second component, such as a reflector, by being secured to the second component, bonded to the second component, mounted to the second component, welded to the second component, fastened to the second component, and/or connected to the second component in some other suitable manner. The first component also may be connected to the second component using a third component. Further, the first component may be considered to be associated with the second component by being formed as part of and/or as an extension of the second component.

As used herein, the phrase "at least one of," when used with a list of items, means different combinations of one or more of the listed items may be used and only one of the items in the list may be needed. The item may be a particular object, thing, or category. In other words, "at least one of" means any combination of items or number of items may be used from the list, but not all of the items in the list may be required.

For example, "at least one of item A, item B, and item C" may mean item A; item A and item B; item B; item A, item B, and item C; or item B and item C. In some cases, "at least one of item A, item B, and item C" may mean, for example, without limitation, two of item A, one of item B, and ten of item C; four of item B and seven of item C; or some other suitable combination.

Each group of reflectors in plurality of groups of reflectors 608 may correspond to one of plurality of solar cells 606. In particular, each of the plurality of groups of reflectors 608 may correspond to one of plurality of solar cells 606 by being positioned relative to the corresponding solar cell such that the group of reflectors is capable of reflecting light 610 towards the corresponding solar cell.

Light 610 may take the form of, for example, without limitation, a beam of light that is comprised of a plurality of rays of light. Light 610 may be natural sunlight, artificial sunlight, or some other type of light. In these illustrative examples, light 610 may originate from light source 611.

Light source 611 may take the form of the sun, an artificial light source, a lamp, or some other type of lighting device or source of light or energy.

Solar cell 612 may be an example of one of plurality of solar cells 606. Solar cell 612 may have focal point 613. Group of reflectors 614 in plurality of groups of reflectors 608 may correspond to solar cell 612. Group of reflectors 614 may include more than one reflector. Each reflector in group of reflectors 614 may be selectively tiltable about at least one axis such that light 610 may be reflected onto focal point 613 of solar cell 612. Light 610 may pass through coverglass 615 and be reflected off group of reflectors 614 to be focused onto solar cell 612. In particular, light 610 may be focused onto focal point 613 of solar cell 612 by group of reflectors 614.

Solar cell 612 may be associated with coverglass 615. In one illustrative example, solar cell 612 may be mounted onto coverglass 615. For example, solar cell 612 may be mounted onto coverglass 615 using an interconnect that is associated with coverglass 615. Solar cell 612 may be attached to the interconnect in an inverted manner, depending on the implementation. The interconnect may be, for example, a metal interconnect. Any number of interconnects may be present on coverglass 615 for holding plurality of solar cells 606. For example, a plurality of interconnects may be used for mounting and holding plurality of solar cells 606 on coverglass 615. In some illustrative examples, bypass diodes may be integrated onto the one or more interconnects on coverglass 615.

In one illustrative example, each reflector in group of reflectors 614 and each reflector in plurality of groups of reflectors 608 may be implemented using a micro-electromechanical systems (MEMS) based reflector. Each reflector may be, for example, a micro-mirror that is tiltable about at least one axis. Group of actuation devices 617 may be associated with group of reflectors 614. Each actuation device in group of actuation devices 617 may be controlled by a voltage. This voltage may also be referred to as an actuation voltage. In some cases, the particular actuation device corresponding to a reflector may be considered part of the overall reflector. In this manner, the reflector may include the structure with the reflective material capable of reflecting light 610, the actuation device, and in some cases, one or more other components. The structure with the reflective material may be a mirror structure.

In some cases, secondary optical device 616 may be associated with solar cell 612. For example, secondary optical device 616 may be mounted onto solar cell 612 such that light 610 may be reflected from group of reflectors 614 through secondary optical device 616 to solar cell 612. Secondary optical device 62 in FIGS. 1-2 may be an example of one implementation for secondary optical device 616. In some cases, secondary optical device 616 may be considered optional.

Control module 618 may be in communication with solar array system 600. In particular, control module 618 may be in communication with each of set of solar arrays 602. For example, control module 618 may be in communication with plurality of solar cells 606 and plurality of groups of reflectors 608 of solar array 604. Control module 618 may be used to control the positioning of each reflector in set of solar arrays 602 such that light 610 may be reflected onto each of the solar cells in set of solar arrays 602.

Control module 618 may be considered part of the control electronics integrated into substrate 609 or separate from these control electronics. In some cases, control module 618 may be implemented in a manner similar to control module 32 in FIG. 1. Using control module 618, the control electronics in substrate 609, or a combination of the two, plurality of groups of reflectors 608 may be controlled to achieve high concentrations of light being reflected onto plurality of solar cells 606.

In one illustrative example, control module 618 may monitor electrical output 622 generated by plurality of solar cells 606 in solar array 604. Electrical output 622 may be in the form of voltage, current, power, or some other type of electrical output. Control module 618 may include control logic 620. Control logic 620 may be used to determine when electrical output 622 is below selected threshold 624. Selected threshold 624 may be selected based on experimentation. Selected threshold 624 may also be referred to as a threshold value.

Selected threshold 624 may be a value or level for electrical output 622. For example, when electrical output 622 takes the form of current, which may also be referred to as electrical current, selected threshold 624 is a level or value of current that may be measured in amperes, milliamperes, or some other unit of current. When electrical output 622 takes the form of voltage, selected threshold 624 is a voltage level that may be measured in volts, millivolts, or some other unit of voltage. Further, when electrical output 622 takes the form of power, selected threshold 624 is a power level that may be measured in joules per second, watts, or some other unit of electrical power.

In one illustrative example, selected threshold 624 may be computed using control logic 620 in control module 618 based on light 610 from light source 611. Light 610 may take the form of ambient light that is available in the area or environment around solar array 604. Selected threshold 624 may be dynamically modified to take into account changes in light 610 that are available for detection by solar array 604 over time. For example, without limitation, light 610 available for detection by solar array 604 may be reduced due to a number of conditions that include, but are not limited to, weather conditions, cloud coverage, foliage, aerial vehicles, other types of obstructions, or some combination thereof.

In some illustrative examples, set of threshold sensors 625 may be used to monitor light 610. Set of threshold sensors 625 may include one or more sensors that measure light 610 to generate sensor data 630. Depending on the implementation, set of threshold sensors 625 may include at least one of a solar cell, a photodiode, or some other type of light sensor. As one illustrative example, set of threshold sensors 625 may take the form of set of threshold solar cells 628.

Sensor data 630 may include any number of measurements generated over time. These measurements may take the form of intensity measurements, electrical current measurements, voltage measurements, power measurements, or some other type of measurement.

In one illustrative example, sensor data 630 includes intensity measurements generated over time. These intensity measurements may take the form of, for example, light intensity-related values in units of lumens, candelas, lux, or some other unit for measuring light intensity. Depending on the implementation, sensor data 630 may include measurements of any parameter that may correlated with the intensity of light 610. For example, without limitation, sensor data 630 may include measurements of intensity, current, voltage, resistance, power, some other type of parameter, or some combination thereof. In some cases, these types of measurements may then be converted into intensity measurements by set of threshold sensors 625 or control module 618.

As one illustrative example, sensor data 630 generated by set of threshold solar cells 628 may take the form of intensity data comprising one or more intensity measurements of light 610. Each of these intensity measurements in sensor data 630 may be the average of the intensity readings generated by set of threshold solar cells 628 for light 610.

In another illustrative example, set of threshold sensors 625 may be implemented as a single threshold sensor 631. Threshold sensor 631 may take the form of, for example, without limitation, threshold solar cell 632 that generates any number of intensity measurements over time to form sensor data 630.

Depending on the implementation, one or more of set of threshold sensors 625 may be mounted to coverglass 615. For example, coverglass 615 may have first side 627 that faces plurality of groups of reflectors 608 and second side 629 that faces light source 611. In one illustrative example, plurality of solar cells 606 may be mounted to first side 627 of coverglass 615, while one or more of set of threshold sensors 625 may be mounted to second side 629 of coverglass 615. For example, without limitation, when light source 611 takes the form of the sun, threshold solar cell 632 may be mounted to second side 629 of coverglass 615 such that threshold solar cell 632 faces upwards towards the sun.

In another illustrative example, one or more of set of threshold sensors 625 may be mounted to and supported by substrate 609. For example, when light source 611 takes the form of the sun, threshold solar cell 632 may be mounted upwards-facing to substrate 609 such that threshold solar cell 632 faces the sun.

In other illustrative examples, one or more of set of threshold sensors 625 may be mounted to some other component of solar array 604 or some other component physically associated with solar array 604. In yet other illustrative examples, one or more of set of threshold sensors 625 may be mounted on a device separate from but located proximately relative to solar array 604. Each of set of threshold sensors 625 may be positioned with respect to the various components of the solar array to ensure that a desired amount of light reaches set of threshold sensors 625 based on the position of light source 611. In some cases, the position of solar array 604 relative to the ground, the orientation of solar array 604 relative to the ground, the position of light source 611 relative to the ground or solar array 604, the orientation of light source 611 relative to the ground or solar array 604, or some combination thereof may be used to determine the placement of each of set of threshold sensors 625.

As one illustrative example, when solar array 604 is oriented substantially parallel to the ground, threshold solar cell 632 may be mounted to coverglass 615 to ensure that the amount of light that reaches threshold solar cell 632 will most directly correlate with the amount of light that reaches plurality of solar cells 606. In another example, solar array 604 may be tilted. Consequently, threshold solar cell 632 may be mounted at or near the end of substrate 609 that is positioned nearest light source 611. In some illustrative examples, threshold solar cell 632 may be removably mounted to coverglass 615, substrate 609, or some other component of or associated with solar array 604 such that threshold solar cell 632 may be mounted to different locations relative to solar array 604 to achieve different configurations tailored for different positions of light source 611 or different types of light source 611.

Control module 618 may receive sensor data 630 and use sensor data 630 to compute selected threshold 624. Control module 618 may use any number of factors, scaling factors, equations, algorithms, mathematical formulas, or combination thereof to compute selected threshold 624 based on sensor data 630.

As one illustrative example, measurement 633 in sensor data 630 may take the form of an electrical current measurement, a voltage measurement, a power measurement, or some other type of measurement. Control module 618 may multiply measurement 633 in sensor data 630 by first factor 634.

First factor 634, which may be n, is a scale factor selected to account for the relative difference in size and configuration between set of threshold sensors 625 and plurality of solar cells 606. First factor 634 may be defined as a decimal number, a fraction, or a percentage, depending on the implementation.

Multiplying first factor 634 by measurement 633 may produce expected maximum output 636, which may be $P_{max}$. Depending on whether measurement 633 is an electrical current measurement, a voltage measurement, or a power measurement, expected maximum output 636 will be an electrical current value, a voltage value, or a power value, respectively. Expected maximum output 636 may be the maximum electrical output 622 expected to be generated by plurality of solar cells 606 when plurality of groups of reflectors 608 are positioned to reflect the highest concentrations of light 610 onto plurality of solar cells 606. When plurality of groups of reflectors 608 are positioned to reflect the highest concentrations of light 610 onto plurality of solar cells 606, plurality of groups of reflectors 608 may be considered to be in a "best focus" state.

Multiplying expected maximum output 636 by second factor 638 produces selected threshold 624. Depending on whether expected maximum output 636 is an electrical current value, a voltage value, or a power value, selected threshold 624 will be an electrical current value threshold, a voltage value threshold, or a power value threshold, respectively, for electrical output 622.

Second factor 638, which may be f, may be a preselected scale factor. Second factor 638 may be defined as a decimal number, a fraction, or a percentage, depending on the implementation. In one illustrative example, second factor 638 may be about 0.99. In this manner, selected threshold 624 may be set to about 99 percent of expected maximum output 636. In another illustrative example, second factor 638 may be selected as a factor between about 0.80 and about 0.99. In still other illustrative examples, second factor 638 may be selected as a factor between about 0.70 and about 0.99.

When measurement 633 takes the form of an intensity measurement, control module 618 may use other factors or some other type of computational process to compute selected threshold 624 for electrical output 622. In one illustrative example, the units of the intensity measurement may be converted into units for an electrical quantity, such as current, voltage, or power, prior to multiplication by first factor 634 and second factor 638.

When electrical output 622 is below selected threshold 624, control logic 620 may reposition plurality of groups of reflectors 608. Repositioning plurality of groups of reflectors 608 may include repositioning at least one reflector in plurality of groups of reflectors 608 by tilting the at least one reflector about at least one axis. This repositioning may be implemented, for example, by adjusting the voltage applied to the actuation device corresponding to the at least one reflector. Thus, control module 618 may control the repositioning of at least one reflector in plurality of groups of reflectors 608 with respect to at least one axis when electrical output 622 is below selected threshold 624.

In this manner, control module 618 having control logic 620 may be used to improve the performance of solar array 604 such that electrical output 622 produced by solar array 604 is sufficiently high. For example, as the direction in which light 610 encounters solar array 604 changes over time, any number of reflectors in plurality of groups of reflectors 608 may need to be repositioned, or tilted differently, to maintain at least selected threshold 624 of electrical output 622 from solar array 604.

The direction in which light 610 encounters solar array 604 may change for a number of different reasons. For example, the location of solar array 604 relative to light source 611 from which light 610 originates may be changed, the position(s) or location(s) of light source 611 may change relative to the solar array 604, or some combination thereof.

In one illustrative example, control module 618 may be used to control each of plurality of groups of reflectors 608 in each solar array in set of solar arrays 602 in a similar manner to improve the performance of each of set of solar arrays 602 in solar array system 600. By controlling the positioning of each group of reflectors in plurality of groups of reflectors 608 based on electrical output 622, control module 618 having control logic 620 may ensure that the highest concentrations of light 610 are focused onto plurality of solar cells 606.

This type of positioning control may allow control module 618 having control logic 620 to dynamically track light source 611 as the relative positioning between solar array 604 and light source 611 changes over time. For example, without limitation, control module 618 having control logic 620 may control the positioning of each reflector in group of reflectors 614 based on electrical output 622. In this manner, control module 618 may ensure that the high concentrations of reflected light focused onto solar cell 612 by group of reflectors 614 are maintained when the position of light source 611 changes relative to solar array 604.

In some illustrative examples, control module 618 may perform dynamic tracking of light source 611 when solar array 604 is in a dynamic tracking mode. In one illustrative example, solar array 604 may be configured to automatically enter the dynamic tracking mode when turned on or when receiving power. In other illustrative examples, control module 618 may be configured to control when solar array 604 enters the dynamic tracking mode and leaves the dynamic tracking mode.

The illustrative examples recognize and take into account that it may be desirable to calibrate solar array 604 just prior to solar array 604 entering the dynamic tracking mode or upon solar array 604 entering the dynamic tracking mode. In some cases, this calibration may be referred to as an initialization of the reflectors in solar array 604. The illustrative examples also recognize and take into account that it may be desirable to recalibrate solar array 604 when solar array 604 loses focus on light source 611. Solar array 604 may lose track of light source 611 for a number of different reasons, including but not limited to, light source 611 moving to a location where light 610 does not reach solar array 604, solar array 604 being moved to a location where solar array 604 no longer receives light 610 from light source 611, the dimming of light 610 from light source 611, turning off power to light source 611, or some other suitable reason.

When solar array 604 loses track of light source 611 such that electrical output 622 is below some minimum output value, it may be desirable to recalibrate solar array 604. For example, solar array 604 may be considered as losing track of light source 611 when the current, voltage, or power output of solar array 604 is substantially zero or below some minimum current level, voltage level, or power level, respectively. In this illustrative example, when solar array 604 loses track of light source 611, each reflector in plurality of groups of reflectors 608 may be moved into a default position. The default position for a reflector may be, for example, without limitation, a position in which reflector is substantially parallel to a plane through solar array 604. This plane may be, for example, the plane of substrate 609.

The illustrative examples recognize and take into account that prior to reinitiating the dynamic tracking of light source 611, it may be desirable to move the reflectors in plurality of groups of reflectors 608 from the default position into a calibrated position. This type of calibration may reduce the overall amount of time needed to regain focus on light source 611. In other words, this type of calibration may reduce the overall amount of time needed for solar array 604 to re-find light source 611 such that electrical output 622 at least reaches selected threshold 624. Further, this type of calibration may improve the accuracy and efficiency with which light source 611 is tracked. Consequently, performing this type of calibration may improve the overall performance of solar array 604.

Figure 7:
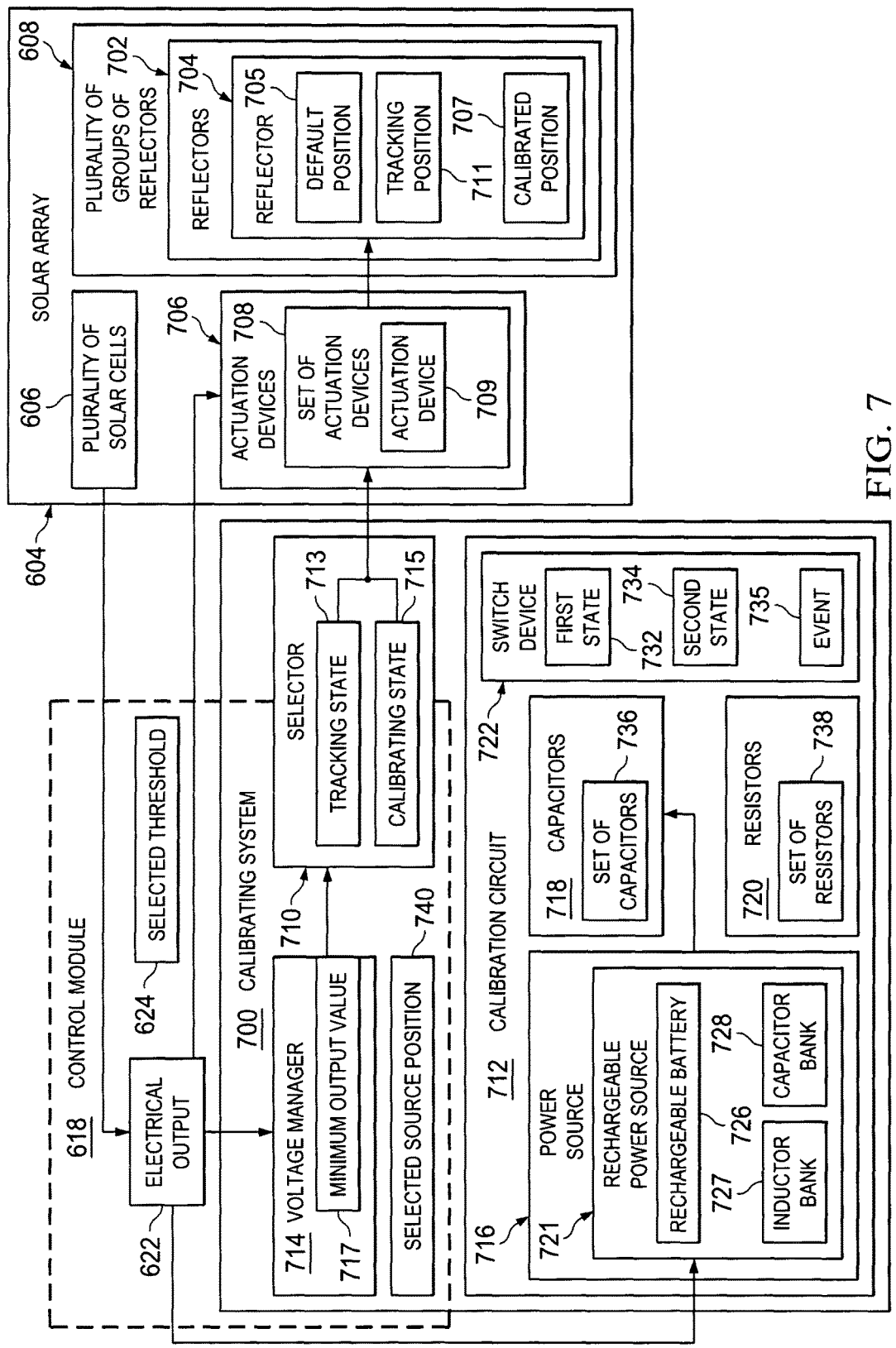
FIG. 7 is an illustration of a calibration system in the form of a block diagram in accordance with an illustrative example.

With reference now to FIG. 7, an illustration of a calibration system is depicted in the form of a block diagram in accordance with an illustrative example. Calibration system 700 may be used to calibrate a plurality of reflectors 702 included in plurality of groups of reflectors 608 using a plurality of actuation devices 706. One or more of actuation devices 706 may be associated with each of reflectors 702. Reflectors 702 may include some or all of the reflectors in plurality of groups of reflectors 608, depending on the implementation.

Calibration system 700 is used to move reflectors 702 from default positions into calibrated positions. Reflector 704 is an example of one of reflectors 702 in plurality of groups of reflectors 608 that may be calibrated using calibration system 700. As depicted, set of actuation devices 708 may be associated with reflector 704. In particular, set of actuation devices 708 includes one or more actuation devices that are used to move reflector 704 with respect to at least one axis. For example, without limitation, set of actuation devices 708 may be used to tilt reflector 704 with respect to at least one axis. Actuation device 709 is an example of one of set of actuation devices 708.

At least a portion of electrical output 622 generated by plurality of solar cells 606 may be used to power actuation devices 708. For example, voltage manager 714 may send at least a portion of electrical output 622 to actuation devices 708 to apply voltages to actuation devices 708. Voltage manager 714 may be implemented using hardware, software, firmware, or both.

The voltage that is applied to each of set of actuation devices 708 associated with reflector 704 determines the position of reflector 704 at a given point in time. In one illustrative example, actuation device 709 is used to tilt reflector 704 about a selected axis. In this example, increasing the voltage applied to actuation device 709 increases the degree of tilt about the selected axis, while decreasing the voltage applied to actuation device 709 decreases the degree of tilt about the selected axis.

Calibrating reflector 704 means moving reflector 704 from default position 705 into calibrated position 707. In default position 705, reflector 704 may be, for example, without limitation, positioned substantially parallel to a plane through solar array 604 in FIG. 6. This plane may be, for example, the plane of substrate 609. Calibrated position 707 may be offset from default position 705 in some manner. For example, calibrated position 707 may be rotationally offset from default position 705 with respect to at least one axis. In one illustrative example, reflector 704 is tilted with respect to at least one axis in calibrated position 707 relative to default position 705.

In this illustrative example, calibration system 700 includes selector 710 and calibration circuit 712. Selector 710 may be considered part of, partially part of, or independent of control module 618, depending on the implementation. In some cases, voltage manager 714 may also be considered part of calibration system 700. In this manner, calibration system 700 may include at least a portion of control module 618.

Selector 710 determines whether voltage manager 714 or calibration circuit 712 is used to power actuation devices 708. In one illustrative example, selector 710 may be implemented in the form of a switch device. The switch device may take the form of, for example, but is not limited to, a single pole, double throw (SPDT) switch. Selector 710 may be controlled by voltage manager 714 in this illustrative example.

Selector 710 may be operable to move between tracking state 713 and calibrating state 715. When selector 710 is in tracking state 713, selector 710 electrically connects voltage manager 714 to actuation devices 708 such that voltage manager 714 supplies power to actuation devices 708. Moving selector 710 from tracking state 713 to calibrating state 715 electrically disconnects voltage manager 714 from actuation devices 708 and electrically connects calibration circuit 712 to actuation devices 708. Conversely, moving selector 710 from calibrating state 715 to tracking state 713 electrically disconnects calibration circuit 712 actuation devices 708, while electrically connecting voltage manager 714 to actuation devices 708.

While selector 710 is in tracking state 713, solar array 604 may lose focus on light source 611 described in FIG. 6. Consequently, electrical output 622 generated by plurality of solar cells 606 may drop. Voltage manager 714 controls selector 710 to switch from tracking state 713 to calibrating state 715 when voltage manager 714 determines that electrical output 622 or at least the portion of electrical output 622 being used to power actuation devices 708 drops below minimum output value 717. Minimum output value 717 may be a minimum preselected value of electrical current, voltage, or power. In some cases, minimum output value 717 may be substantially zero.

In one illustrative example, the switching of selector 710 from tracking state 713 to calibrating state 715 causes reflectors 702 to move into their default positions because power is no longer being supplied to actuation devices 706. Reflectors 702 may remain in these default positions until they are recalibrated by calibration circuit 712.

In calibrating state 715, selector 710 electrically connects calibration circuit 712 to actuation devices 708. In one illustrative example, calibration circuit 712 includes power source 716, a plurality of capacitors 718, a plurality of resistors 720, and switch device 722. Power source 716 is used to charge capacitors 718 over time. Resistors 720 are used to control the charging rate and discharging rate of capacitors 718.

Power source 716 may take a number of different forms. In this illustrative example, power source 716 takes the form of rechargeable power source 721. Rechargeable power source 721 may include rechargeable battery 726, capacitor bank 728, inductor bank 727, some other type of rechargeable source of electrical power, or some combination thereof.

Switch device 722 may be implemented using, for example, without limitation, an open-close switch. In some illustrative examples, switch device 722 may be comprised of a plurality of switch members. Each of these switch members may take the form of an open-close switch or some other type of switching mechanism.

Switch device 722 may switch between first state 732 and second state 734. Switch device 722 in first state 732 prevents power source 716 from charging capacitors 718. Conversely, switch device 722 in second state 734 allows power source 716 to charge capacitors 718 when switch device 722 is in second state 734.

When selector 710 is in calibrating state 715, and switch device 722 is in first state 732, any energy stored in capacitors 718 may be discharged and allowed to flow to actuation devices 708. If capacitors 718 are fully discharged when selector 710 is in calibrating state 715, no power is supplied to actuation devices 708. When switch device 722 is switched from first state 732 to second state 734, power source 716 can then charge capacitors 718.

In some cases, switch device 722 may be manually operated to switch between first state 732 and second state 734. For example, manually pressing a button associated with solar array 604 may cause switch device 722 to move from first state 732 to second state 734. In another illustrative example, switch device 722 may be at least one of mechanically or electrically configured to switch between first state 732 and second state 734 without human intervention.

In one illustrative example, switch device 722 may be manually operated to switch from first state 732 to second state 734 but may be configured to switch from second state 734 to first state 732 automatically in response to event 735 occurring. Event 735 may be, for example, without limitation, a lapse of a preselected period of time or a timer, receiving an electrical signal, or some other type of event. The preselected period of time may be, for example, without limitation, between about 2 milliseconds and about 100 milliseconds, depending on the implementation. In another illustrative example, the preselected period of time may be between about 50 milliseconds and about 2 seconds.

In some illustrative examples, event 735 may be selected such that switch device 722 moves from second state 734 to first state 732 before any of capacitors 718 can be fully charged. In this manner, the creation of an open circuit by one or more fully charged capacitors may be prevented.

In one illustrative example, set of capacitors 736 and set of resistors 738 are used to control the voltage applied to set of actuation devices 708 associated with reflector 704. For example, upon solar array 604 losing track of light source 611 as described in FIG. 6, selector 710 may switch from tracking state 713 to calibrating state 715, thereby causing reflector 704 to move from a current position of reflector 704 into default position 705. The current position of reflector 704 may be, for example, without limitation, tracking position 711. Tracking position 711 may be the position of reflector 704 during tracking state 713. Tracking position 711 of reflector 704 may change over time during tracking state 713.

At some point later in time, switch device 722 may be moved from first state 732 into second state 734, thereby allowing power source 716 to send electrical power to set of actuation devices 708 associated with reflector 704 and to charge set of capacitors 736. Set of capacitors 736 may be charged to some predetermined level for some preselected period of time needed to apply a calibration voltage to each of set of actuation devices 708. Applying this calibration voltage to each of set of actuation devices 708 moves reflector 704 from default position 705 to calibrated position 707.

In response to event 735 occurring, switch device 722 moves back from second state 734 to first state 732, halting the charging of set of capacitors 736 by power source 716. Set of capacitors 736 begins discharging slowly. Together, set of capacitors 736 and set of resistors 738 maintain the calibration voltage applied to each of set of actuation devices 708 for at least a desired period of time.

In particular, the resistance of each of set of resistors 738 and the capacitance of each of set of capacitors 736 is selected such that a corresponding calibration voltage can be maintained at each of set of actuation devices 708. Depending on the implementation, the calibration voltage may be the same or different for each of set of actuation devices 708. In this manner, reflector 704 may be held in calibrated position 707 for at least the desired period of time.

This desired period of time may be used for solar array 604 to regain focus on light source 611 in FIG. 1. In particular, once reflectors 702 are in their calibrated positions, voltage manager 714 may monitor electrical output 622 and determine whether electrical output 622 rises above minimum output value 717 or some other preselected value for current, voltage, or power.

In other words, once reflectors 702 are in their calibrated positions, voltage manager 714 is used to determine whether electrical output 622 is sufficient to move selector 710 from calibrating state 715 to tracking state 713. If electrical output 622 is sufficient, selector 710 is moved from calibrating state 715 to tracking state 713. In tracking state 713, solar array 604, using control module 618, may perform dynamic tracking of light source 611 as described above in FIG. 6. By starting this dynamic tracking with reflectors 702 in their calibrated positions, the overall amount of time needed to dynamically track light source 611 in FIG. 6 may be reduced.

In some illustrative examples, the energy generated by plurality of solar cells 606 may be used to recharge rechargeable power source 721. For example, rechargeable power source 721 may be configured to fully charge capacitors 718 many times before rechargeable power source 721 needs to be recharged. Depending on the implementation, at least a portion of electrical output 622 generated by plurality of solar cells 606 may be siphoned to recharge rechargeable power source 721. This recharging may be set to occur anytime that solar array 604 enters the dynamic tracking mode, after some predetermined number of state switches of switch device 722, or in response to the occurrence of some other type of event.

In this manner, calibration system 700 may improve the overall performance of solar array 604. In particular, calibration system 700 improves the efficiency with which solar array 604 tracks light source 611 in FIG. 6.

Similar calibration may be performed for any other solar arrays that may be present in set of solar arrays 602 in solar array system 600 in FIG. 6. Depending on the implementation, a single calibration system 700 may be used to calibrate each of set of solar arrays 602 in solar array system 600 in FIG. 6. In some cases, more than one calibration system may be used to calibrate the reflectors in solar array system 600 in FIG. 6.

In some illustrative examples, the calibrated positions selected for reflectors 702 may be selected based on selected source position 740 for light source 611 in FIG. 6. Selected source position 740 may be an angular position, $(\theta, \phi)$.

Depending on the implementation, selected source position 740 may be, but is not limited to, an expected current position, a known current position, a computed current position, an estimated position, or otherwise-determined position of light source 611 relative to solar array 604 at the time at which solar array 604 enters the dynamic tracking mode or a time just prior to solar array 604 entering the dynamic tracking mode. In one illustrative example, when light source 611 takes the form of the sun, selected source position 740 may be an initial source position for the sun, which may be expected based on, for example, without limitation, the current calendar date, current time of day, some other piece of information, or some combination thereof.

The illustrations of solar array system 600 in FIG. 6 and calibration system 700 in FIG. 7 is not meant to imply physical or architectural limitations to the manner in which an illustrative example may be implemented. Other components in addition to or in place of the ones illustrated may be used. Some components may be optional. Also, the blocks are presented to illustrate some functional components. One or more of these blocks may be combined, divided, or combined and divided into different blocks when implemented in an illustrative example.

For example, in some cases, an individual control module may be associated with each of set of solar arrays 602 instead of control module 618 controlling each of set of solar arrays 602. In some illustrative examples, a portion of plurality of solar cells 606 may each be associated with a secondary optical device while another portion of plurality of solar cells 606 may not be associated with a secondary optical device.

In other illustrative examples, calibration circuit 712 may include other electrical components in addition to or in place of capacitors 718 and resistors 720. For example, in some cases, calibration circuit 712 may include one or more inductors. Calibration circuit 712 may be implemented in any of a number of different ways that allow calibration circuit 712 to be electrically connected to and disconnected from actuation devices 706 and that allow the calibration voltage to be applied to each of actuation devices 706 maintained for some period of time when calibration circuit 712 is electrically connected to actuation devices 706.

Figure 8:
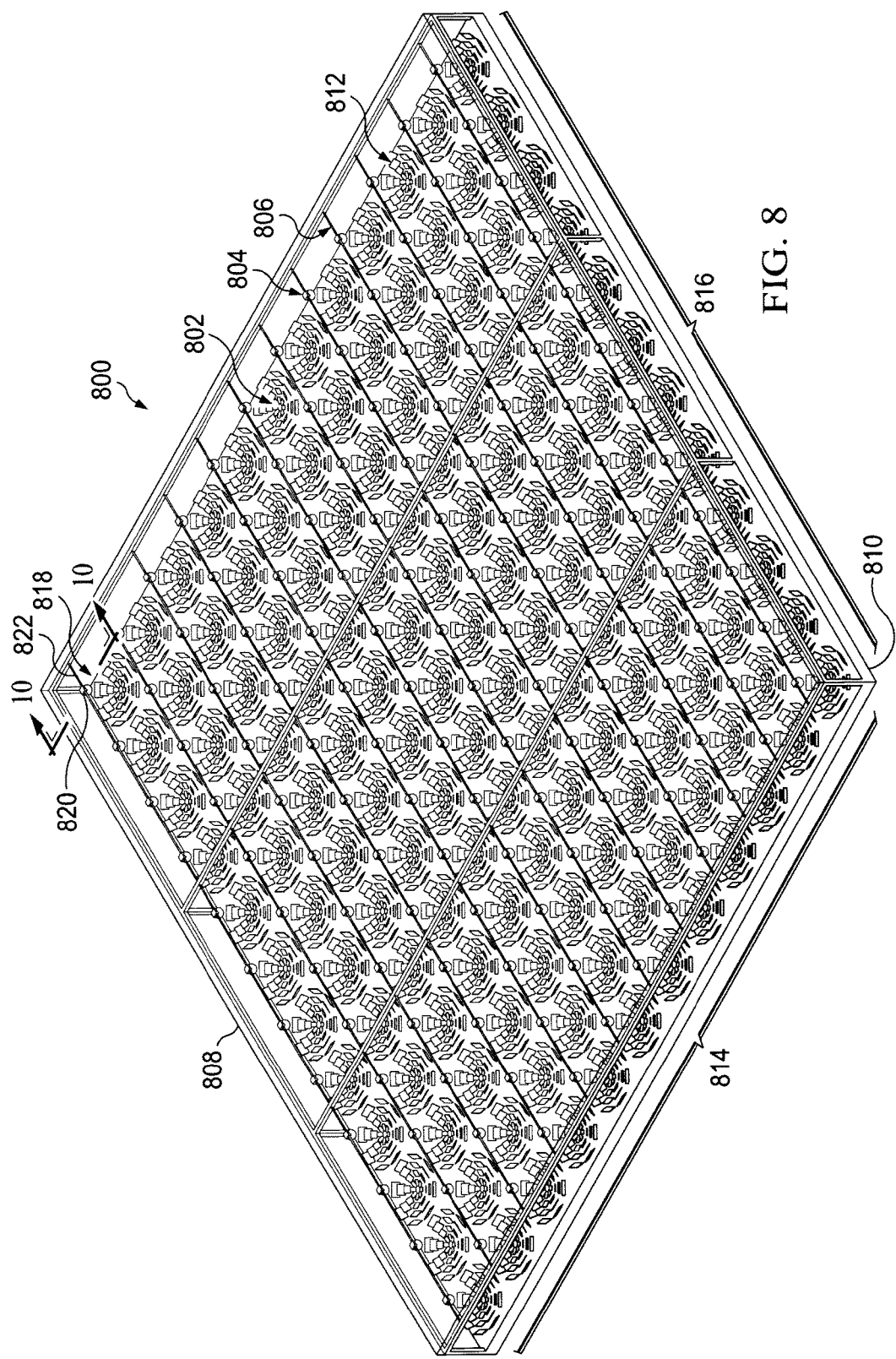
FIG. 8 is an illustration of a solar array in accordance with an illustrative example.

With reference now to FIG. 8, an illustration of a solar array is depicted in accordance with an illustrative example. In this illustrative example, solar array 800 may be an example of one implementation for solar array 604 in FIG. 6. As depicted, solar array 800 may include plurality of groups of reflectors 802 and plurality of solar cells 804, which may be examples of implementations for plurality of groups of reflectors 608 and plurality of solar cells 606, respectively, in FIG. 6.

As depicted, plurality of solar cells 804 are connected to plurality of interconnects 806 on coverglass 808. Plurality of secondary optical devices 812 may be mounted onto plurality of solar cells 804. In particular, each of plurality of secondary optical devices 812 may be mounted onto a corresponding one of plurality of solar cells 804.

Plurality of groups of reflectors 802 are supported by substrate 810. Plurality of groups of reflectors 802 are arranged in rows 814 and columns 816. Plurality of groups of reflectors 802 may form a 12 by 12 array in this illustrative example.

Group of reflectors 818 may be an example of one of plurality of groups of reflectors 802. Solar cell 820 may correspond to group of reflectors 818. Solar cell 820 may be connected to interconnect 822 of plurality of interconnects 806. Group of reflectors 818 may be configured to reflect a beam of light to focus the reflected beam of light onto solar cell 820.

Figure 9:
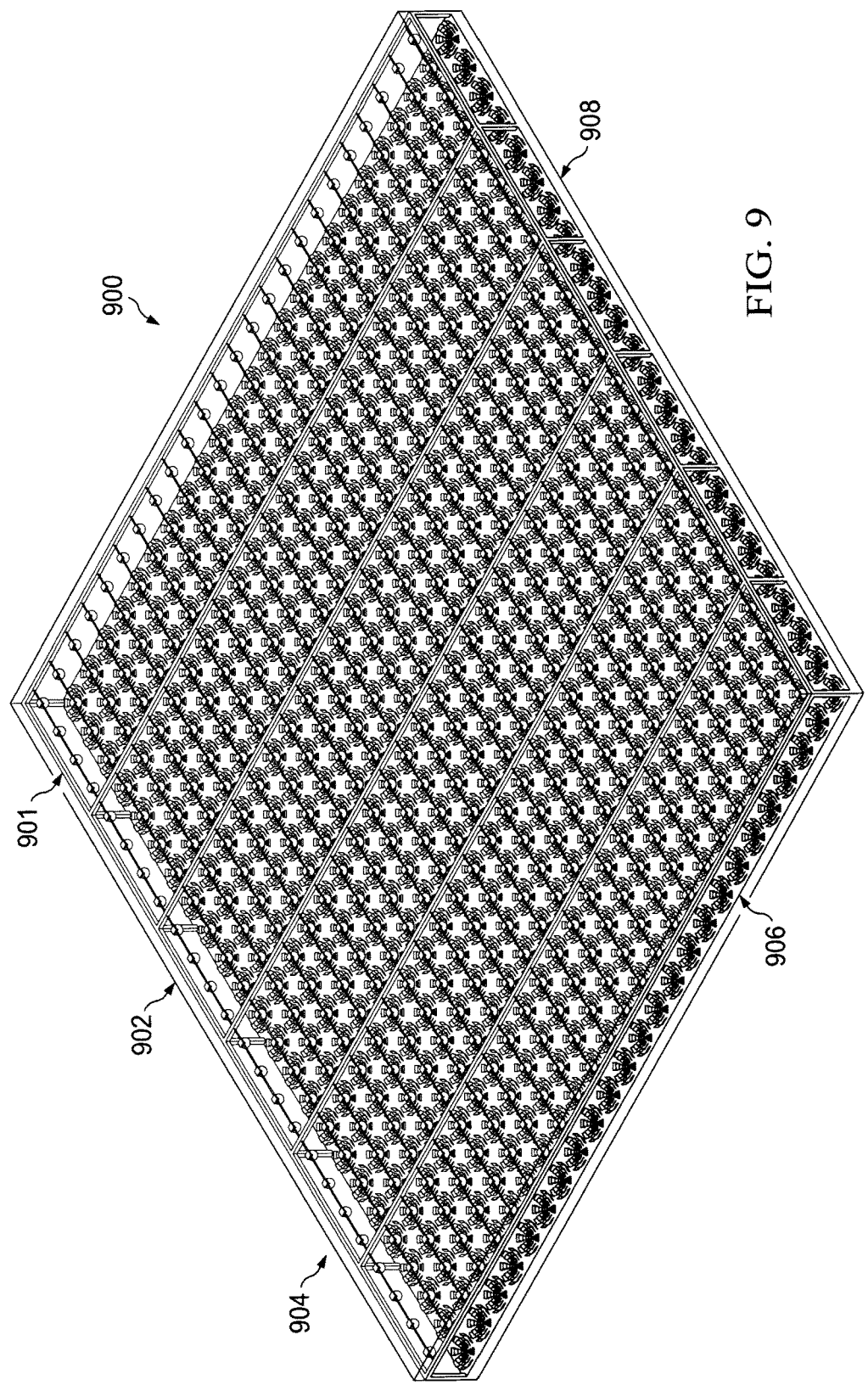
FIG. 9 is an illustration of a solar array system in accordance with an illustrative example.

With reference now to FIG. 9, an illustration of a solar array system is depicted in accordance with an illustrative example. In this illustrative example, solar array system 900 may be an example of one implementation for solar array system 600 in FIG. 6. Solar array system 900 may include set of solar arrays 901. Set of solar arrays 901 includes solar arrays 902, 904, 906, and 908. Each of set of solar arrays 901 may be implemented in a manner similar to solar array 800 in FIG. 8.

Figure 10:
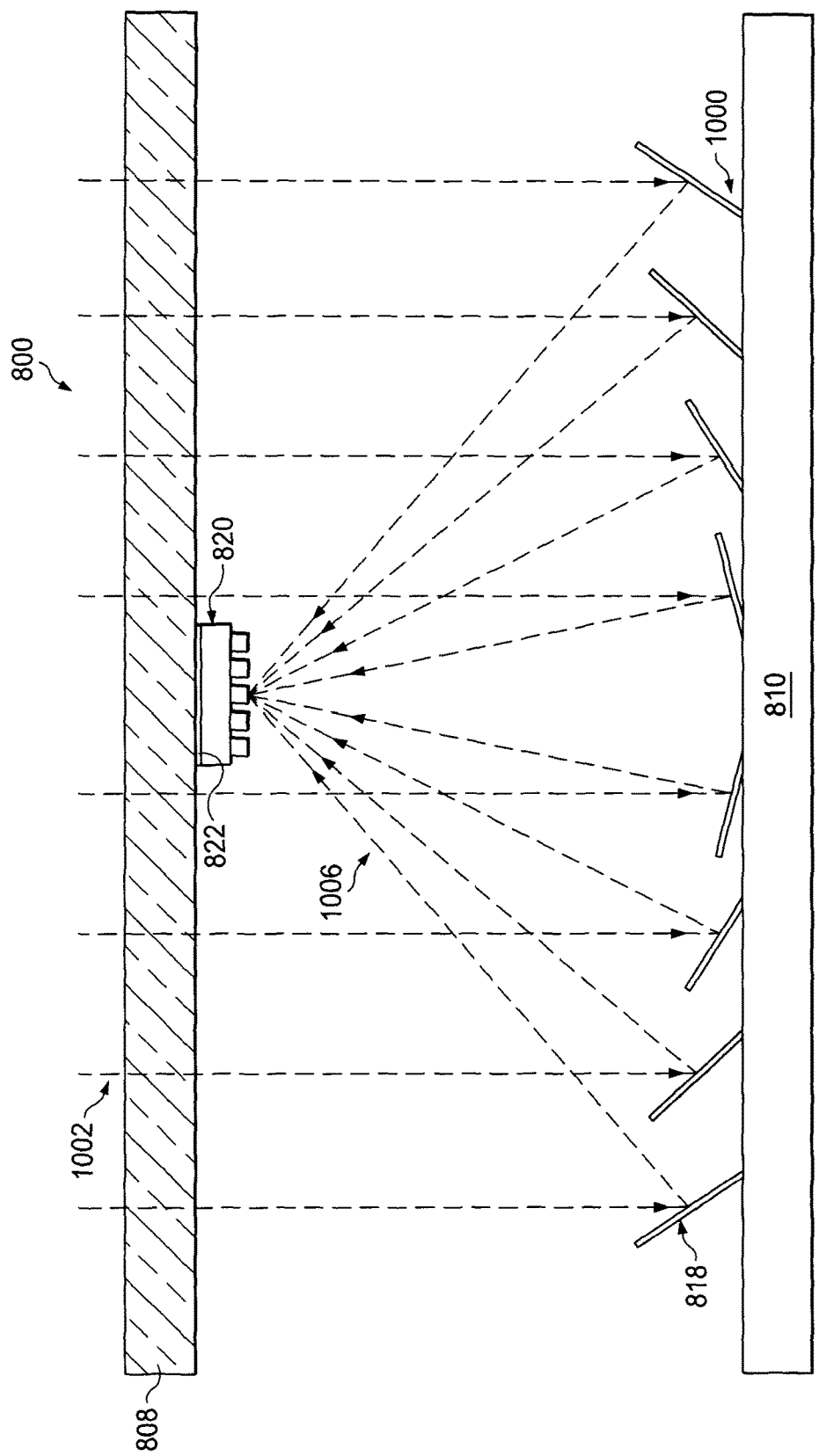
FIG. 10 is an illustration of a cross-sectional view of a solar array in accordance with an illustrative example.

With reference now to FIG. 10, an illustration of a cross-sectional view of solar array 800 from FIG. 8 is depicted in accordance with an illustrative example. In this illustrative example, a cross-sectional view of solar array 800 from FIG. 8 is depicted taken in the view of lines 10-10 in FIG. 8. However, in this illustrative example, the secondary optical device mounted onto solar cell 820 in FIG. 8 has been optionally excluded.

As depicted, portion 1000 of group of reflectors 818 may be seen. Beam of light 1002 may pass through coverglass 808 and become incident on group of reflectors 818. Beam of light 1002 is reflected by group of reflectors 818 in the form of reflections 1006 that are focused onto a focal point of solar cell 820. In this illustrative example, beam of light 1002 may pass through coverglass 808 at an angle perpendicular to coverglass 808.

However, the angle at which beam of light 1002 passes through coverglass 808 may change over time. A control module, such as control module 618 in FIG. 6, may be used to reposition one or more reflectors in group of reflectors 818 to ensure that the electrical output of solar cell 820 is kept at or above a selected threshold.

Figure 11:
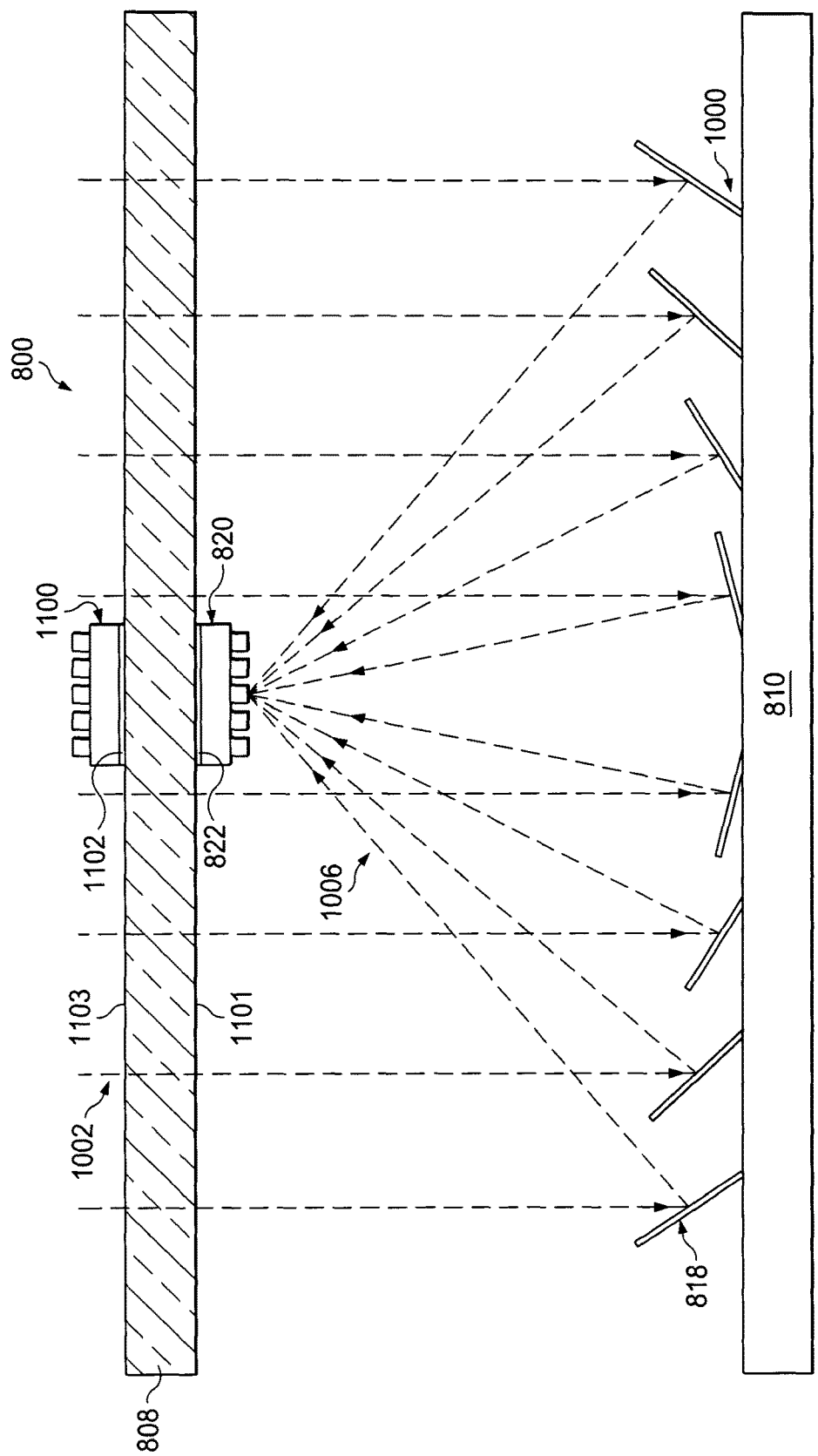
FIG. 11 is an illustration of a solar array having a threshold solar cell in accordance with an illustrative example.

With reference now to FIG. 11, an illustration of solar array 800 from FIG. 10 having a threshold solar cell is depicted in accordance with an illustrative example. As depicted, coverglass 808 has first side 1101 and second side 1103. Solar cell 820 may be mounted to first side 1101, while threshold solar cell 1100 may be mounted to second side 1103. Threshold solar cell 1100 may be an example of one implementation for one of set of threshold solar cells 628 in FIG. 6. Further, threshold solar cell 1100 may be an example of one implementation for threshold solar cell 632 in FIG. 6.

As depicted, in a manner similar to the mounting of solar cell 820 to first side 1101 of coverglass 808 through interconnect 822, threshold solar cell 1100 is mounted to second side 1103 of coverglass 808 through interconnect 1102. Threshold solar cell 1100 is mounted upwards-facing such that threshold solar cell 1100 may measure the intensity of the light around solar array 800.

Figure 12:
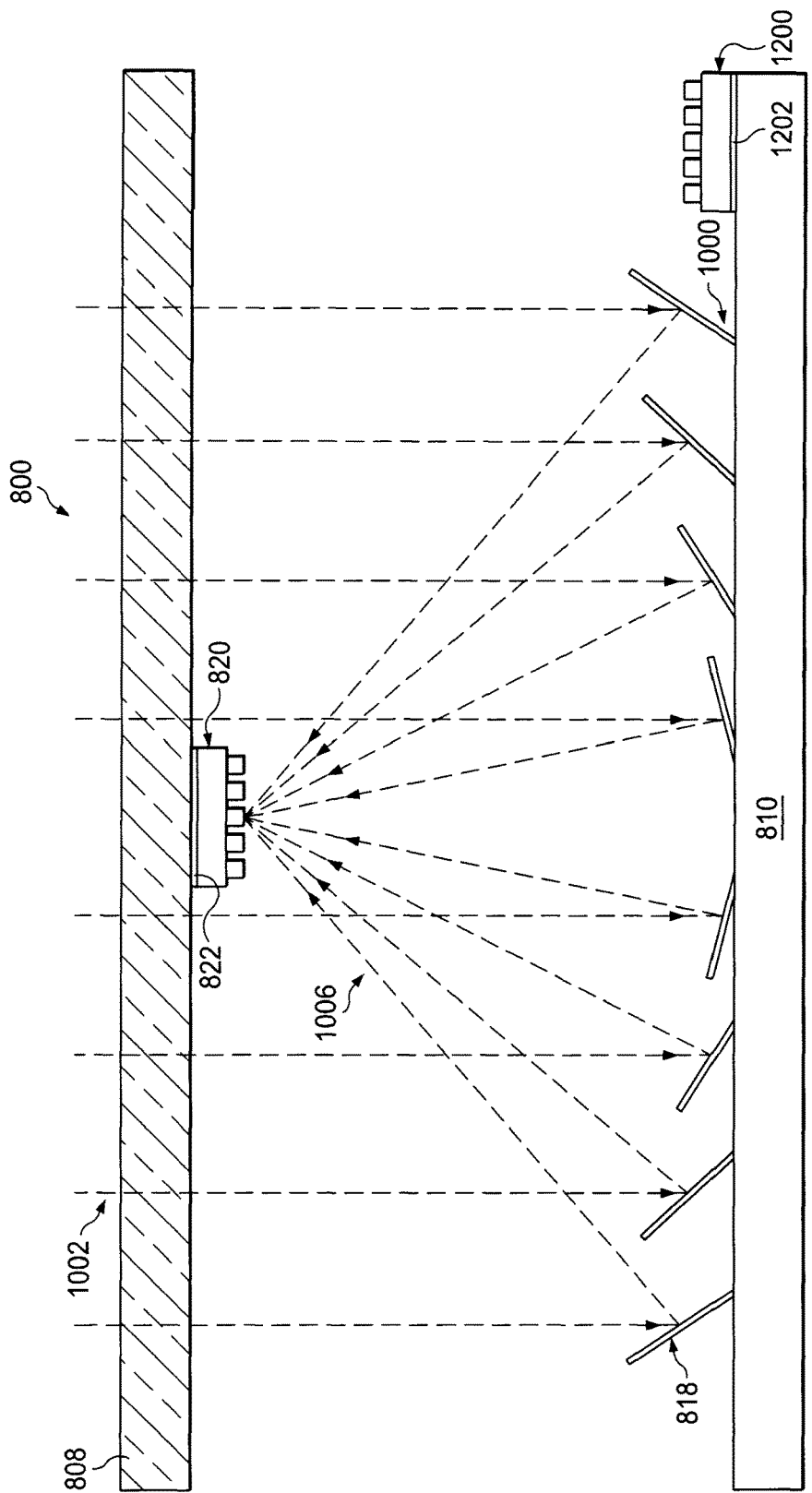
FIG. 12 is an illustration of a solar array having a threshold solar cell in accordance with an illustrative example.

With reference now to FIG. 12, another illustration of solar array 800 from FIG. 10 having a threshold solar cell is depicted in accordance with an illustrative example. As depicted, threshold solar cell 1200 may be mounted to and supported by substrate 810. Threshold solar cell 1200 may be an example of one implementation for one of set of threshold solar cells 628 in FIG. 6. Further, threshold solar cell 1200 may be an example of one implementation for threshold solar cell 632 in FIG. 6.

As depicted, threshold solar cell 1200 is mounted to substrate 810 through interconnect 1202. Threshold solar cell 1200 is mounted upwards-facing such that threshold solar cell 1200 may measure the intensity of the light around solar array 800.

The illustrations of solar array 800 in FIGS. 8, 10 11, and 12, and solar array system 900 in FIG. 9 are not meant to imply physical or architectural limitations to the manner in which an illustrative example may be implemented. Other components in addition to or in place of the ones illustrated may be used. Some components may be optional.

The different components shown in FIGS. 1-4, FIG. 5, and FIGS. 8-12 may be illustrative examples of how components shown in block form in FIG. 6 can be implemented as physical structures. Additionally, some of the components in FIGS. 1-4, FIG. 5, and FIGS. 8-12 may be combined with components in FIG. 6, used with components in FIG. 6, or a combination of the two.

Figure 13:
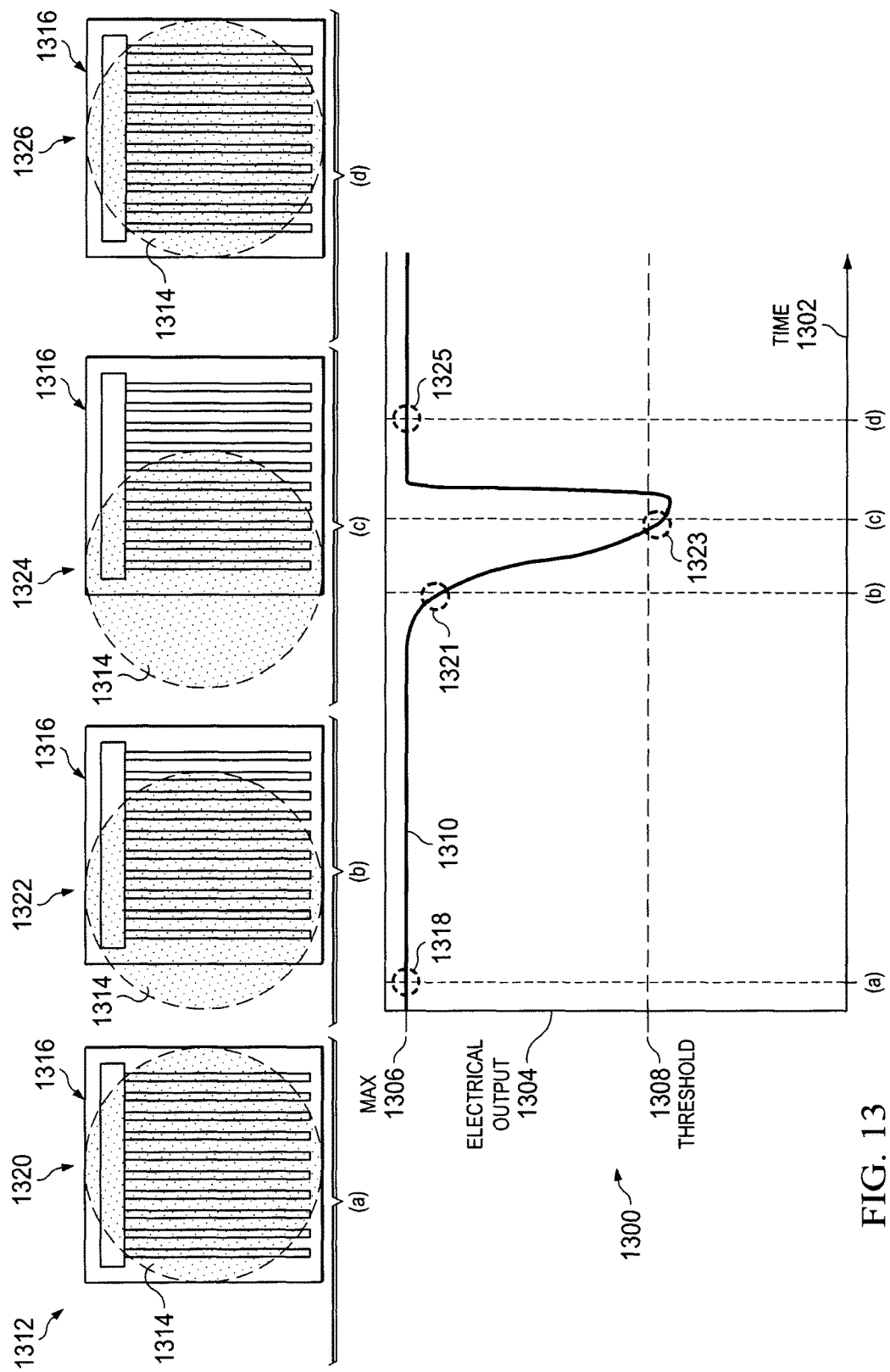
FIG. 13 is an illustration of a graph of an electrical output corresponding to a changing position of a light source in accordance with an illustrative example.

With reference now to FIG. 13, an illustration of a graph of an electrical output corresponding to a changing position of a light source is depicted in accordance with an illustrative example. In this illustrative example, graph 1300 includes horizontal axis 1302 and vertical axis 1304. Horizontal axis 1302 is time, while vertical axis 1304 may be electrical output. The electrical output may be the voltage output, current output, or power output of a solar cell, such as solar cell 820 in FIGS. 8, 10, 11, and 12.

Selected threshold 1308 may be the threshold level of electrical output computed based on the intensity data generated by a threshold solar cell, such as threshold solar cell 1100 in FIG. 11 or threshold solar cell 1200 in FIG. 12. Curve 1310 indicates how electrical output changes over time in response to the changing position of a light source.

For example, curve 1310 indicates how electrical output changes over time based on the different positions 1312 of spot of light 1314 focused on solar cell 1316. Spot of light 1314 may be a "focused spot" created by the reflectors in the solar array to which solar cell 1316 belongs reflecting light onto solar cell 1316. In this illustrative example, spot of light 1314 is shown as circular. However, in other illustrative examples, spot of light 1314 may have some other shape. For example, spot of light 1314 may be oval, elliptical, square, rectangular, or have some other type of shape.

Point 1318 along curve 1310 corresponds to position 1320 for spot of light 1314. At point 1318, the maximum electrical output is generated by solar cell 1316 due to spot of light 1314 being fully focused on solar cell 1316. In other words, the reflectors in the solar array are positioned such that light is reflected in a manner that creates spot of light 1314 at position 1320.

When the light source moves, spot of light 1314 that is created may also move relative to solar cell 1316. As indicated by point 1321 along curve 1310, when spot of light 1314 has position 1322 relative to solar cell 1316, the electrical output may drop below the maximum electrical output. As indicated by point 1323 along curve 1310, when spot of light 1314 has position 1324 relative to solar cell 1316, the electrical output may drop below selected threshold 1308.

When the electrical output drops below selected threshold 1308, the reflectors in the solar array may be repositioned to "refocus" the reflected light onto solar cell 1316. In particular, at least one of the reflectors in the solar array may be repositioned with respect to at least one axis. For example, at least one of the reflectors may be tilted at a different angle with respect to at least one axis. This type of refocusing repositions spot of light 1314 such that spot of light 1314 may have position 1326 relative to solar cell 1316. With spot of light 1314 having position 1326, the electrical output generated by solar cell 1316 may again reach the maximum electrical output, as indicated by point 1325 along curve 1310.

Figure 14:
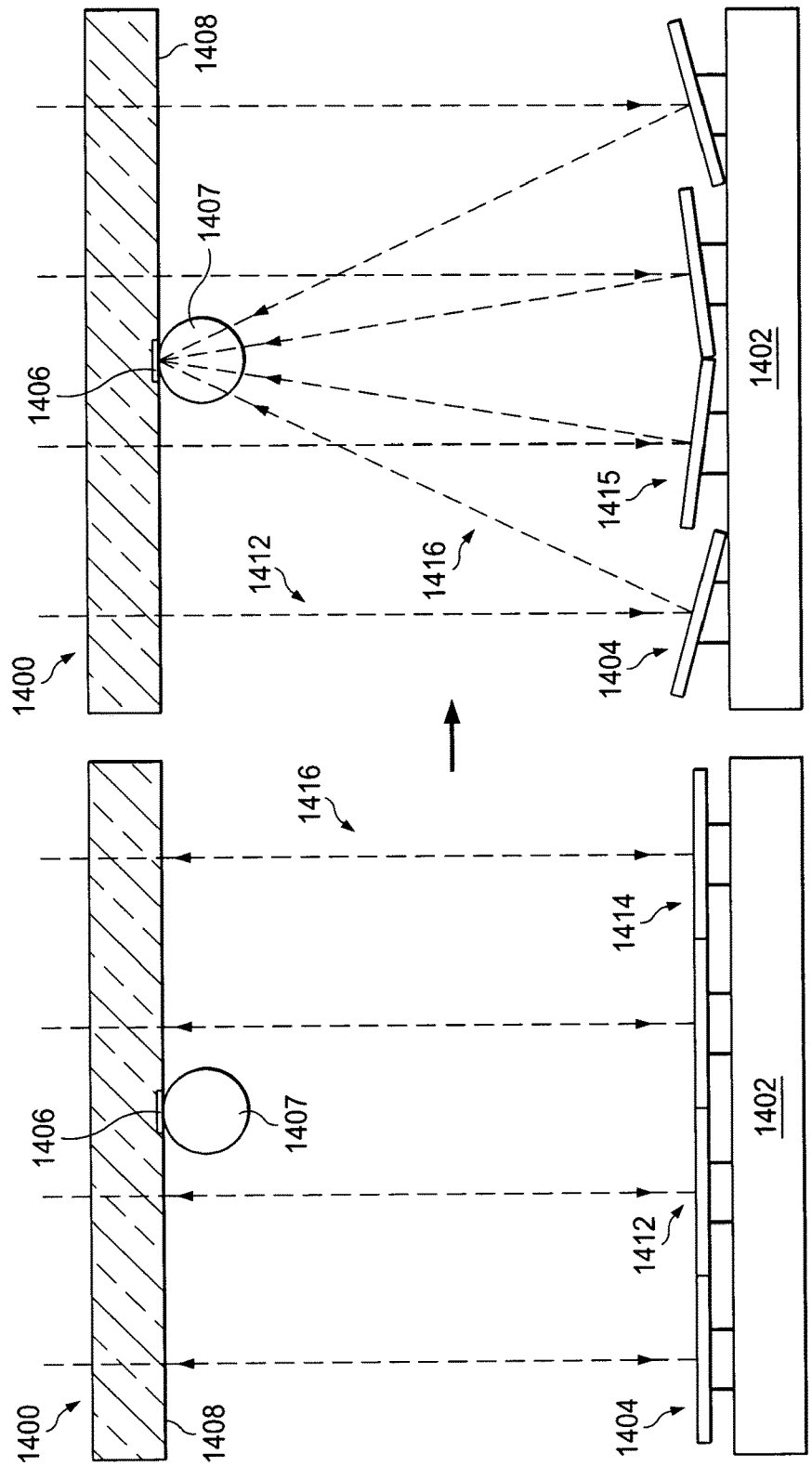
FIG. 14 is an illustration of a solar array in accordance with an illustrative example.

With reference now to FIG. 14, an illustration of a side view of a group of reflectors in default positions and in calibrated positions is depicted in accordance with an illustrative example. In this illustrative example, a side view of a portion of solar array 1400 is depicted. Solar array 1400 includes substrate 1402, group of reflectors 1404, solar cell 1406, secondary optics 1407, and coverglass 1408.

As depicted, light 1412 is being received by group of reflectors 1404. The reflectors in group of reflectors 1404 are in default positions 1414. Default positions 1414 are examples of implementations for default position 705 in FIG. 7. In default positions 1414, these reflectors are positioned substantially parallel to substrate 1402. With default positions 1414, reflected light 1416 is not focused onto solar cell 1406.

However, as depicted, when the reflectors in group of reflectors 1404 are moved into calibrated positions 1415, reflected light 1416 is focused onto solar cell 1406. Calibrated positions 1415 are examples of implementations for calibrated position 707 in FIG. 7.

Figure 15:
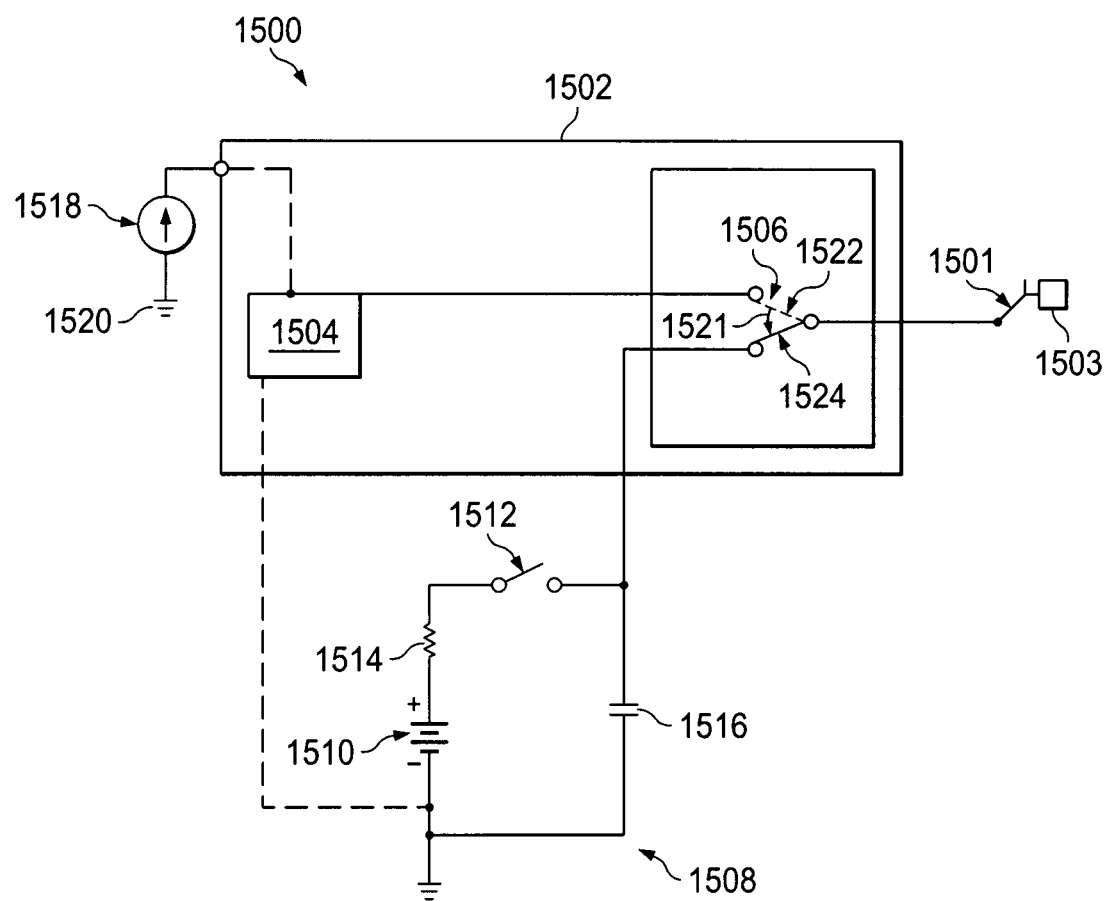
FIG. 15 is an illustration of a calibration system in accordance with an illustrative example.

With reference now to FIG. 15, a schematic diagram of a calibration system is depicted in accordance with an illustrative example. In this illustrative example, a schematic diagram of calibration system 1500 is depicted in accordance with an illustrative example. Calibration system 1500 may be an example of calibration system 700 described in FIG. 7. In this illustrative example, calibration system 1500 is at least partially implemented using control module 1502, which may be an example of control module 618 in FIG. 1.

In this illustrative example, calibration system 1500 is used for calibrating reflector 1503 that is connected to actuation device 1501. Reflector 1503 may take the form of a micro-electromechanical systems based reflector, which may take the form of a micro-electromechanical systems based mirror. Actuation device 1501 is an example of actuation device 709 in FIG. 7.

Calibration system 1500 includes voltage manager 1504, selector 1506, and calibration circuit 1508. Voltage manager 1504, selector 1506 and calibration circuit 1508 may be examples of implementations for voltage manager 714, selector 710, and calibration circuit 712, respectively, in FIG. 7. When tracking a light source, voltage manager 1504 determines the voltage that needs to be applied to actuation device 1501 to best focus reflector 1503 associated with actuation device 1501.

In this illustrative example, calibration circuit 1508 includes rechargeable battery 1510, switch device 1512, resistor 1514, and capacitor 1516. Rechargeable battery 1510, switch device 1512, resistor 1514, and capacitor 1516 may be examples of implementations for rechargeable battery 726, switch device 722, set of resistors 738, and set of capacitors 736, respectively, in FIG. 7. In this illustrative example, switch device 1512 is shown open, which may be an example of first state 732 in FIG. 7.

Electrical output 1518 from one or more solar cells (not shown), which are connected to ground 1520, is received at control module 1502. When selector 1506 is in tracking state 1522, voltage manager 1504 is electrically connected to actuation device 1501, while calibration circuit 1508 is electrically disconnected from actuation device 1501.

Voltage manager 1504 uses at least a portion of electrical output 1518 to supply power to actuation device 1501. When electrical output 1518 drops to substantially zero in this illustrative example, voltage manager 1504 may control selector 1506 to move selector 1506 in the direction of arrow 1521 from tracking state 1522 to calibrating state 1524, thereby electrically connecting calibration circuit 1508 to actuation device 1501 and electrically disconnecting voltage manager 1504 from actuation device 1501.

With selector 1506 in calibrating state 1524, electrical power is allowed to flow from calibration circuit 1508 to actuation device 1501 when capacitor 1516 is charged. However, capacitor 1516 may not yet be storing any energy. Thus, the voltage being applied to actuation device 1501 is substantially zero such that reflector 1503 is in a default position.

At some point in time after selector 1506 moving to calibrating state 1524, switch device 1512 may be closed. This closing action may be performed in response to a manual action by a human, a mechanical operation, receiving an electrical signal, or some other action. When switch device 1512 is closed, rechargeable battery 1510 begins charging capacitor 1516 and sending power to actuation device 1501. With the aid of the voltage divider provided by resistor 1514 and capacitor 1516, the voltage applied to actuation device 1501 increases until a calibration voltage is reached. The calibration voltage is the voltage needed to operate actuation device 1501 such that reflector 1503 is tilted into the proper calibration position.

Switch device 1512 remains closed only for a preselected period of time before reopening in this illustrative example. This preselected period of time may be a period of time less than the time needed to fully charge capacitor 1516. The preselected period of time may be in, for example, without limitation, seconds, milliseconds, or some other unit of time. In one illustrative example, the preselected period of time may be between about 2 milliseconds and about 50 milliseconds. Once switch device 1512 opens, the calibration voltage being applied to actuation device 1501 is maintained using resistor 1514 and capacitor 1516 that begins discharging.

With actuation device 1501 receiving the calibration voltage, the calibration position of reflector 1503 is also maintained such that electrical output 1518 may be increased. When electrical output 1518 has increased sufficiently such that dynamic tracking of the light source may be initiated, voltage manager 1504 controls selector 1506 to move selector 1506 from calibrating state 1524 to tracking state 1522. If capacitor 1516 discharges before tracking of the light source can be initiated, switch device 1512 may be closed again and the process described above repeated.

In some cases, voltage manager 1504 may use a portion of electrical output 1518 to recharge rechargeable battery 1510. In other words, a portion of electrical output 1518 may be siphoned off to recharge rechargeable battery 1510.

Figure 16:
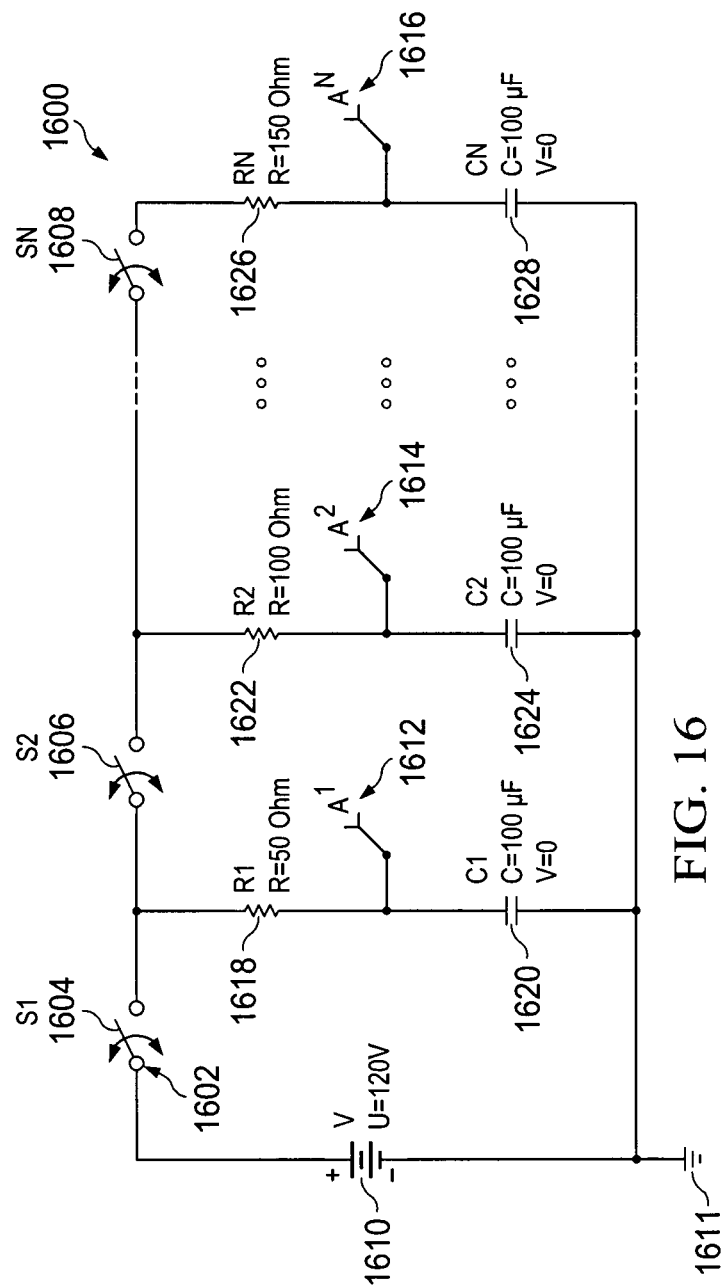
FIG. 16 is an illustration of a calibration circuit in accordance with an illustrative example.

With reference now to FIG. 16, a schematic diagram of a calibration circuit is depicted in accordance with an illustrative example. In this illustrative example, calibration circuit 1600 may be an example of one implementation for calibration circuit 712 in FIG. 7.

Calibration circuit 1600 includes switch device 1602. Switch device 1602 includes switch member 1604, switch member 1606, and switch member 1608. In this manner, switch device 1602 may include any number of switch members. In this illustrative example, switch device 1602 is configured such that all of switch members of switch device 1602 open substantially simultaneously and close substantially simultaneously.

Switch member 1604, switch member 1606, and switch member 1608 may control when rechargeable battery 1610 is used to power actuation device 1612, actuation device 1614, and actuation device 1614, respectively. Rechargeable battery 1610 is connected to ground 1611. In one illustrative example, actuation device 1612, actuation device 1614, and actuation device 1614 are an example of one implementation for set of actuation devices 708 in FIG. 7. In this example, actuation device 1612, actuation device 1614, and actuation device 1614 may all correspond to a same reflector. In other illustrative examples, each of actuation device 1612, actuation device 1614, and actuation device 1614 may correspond to a different reflector.

As depicted, calibration circuit 1600 also includes resistor 1618, capacitor 1620, resistor 1622, capacitor 1624, resistor 1626, and capacitor 1628. In this illustrative example, the resistance of each of these resistors and the capacitance of each of these capacitors enables the proper calibration voltage to be substantially maintained at each of actuation device 1612, actuation device 1614, and actuation device 1616.

The illustrations of solar array 1400 in FIG. 14, calibration system 1500 in FIG. 15, and calibration circuit 1600 in FIG. 16 are not meant to imply physical or architectural limitations to the manner in which an illustrative example may be implemented. Other components in addition to or in place of the ones illustrated may be used. Some components may be optional.

The different components shown in FIGS. 14-16 may be illustrative examples of how components shown in block form in FIGS. 6-7 can be implemented as physical structures or described schematically. Additionally, some of the components in FIGS. 14-16 may be combined with components in FIGS. 6-7, used with components in FIGS. 6-7, or a combination of the two.

Figure 17:
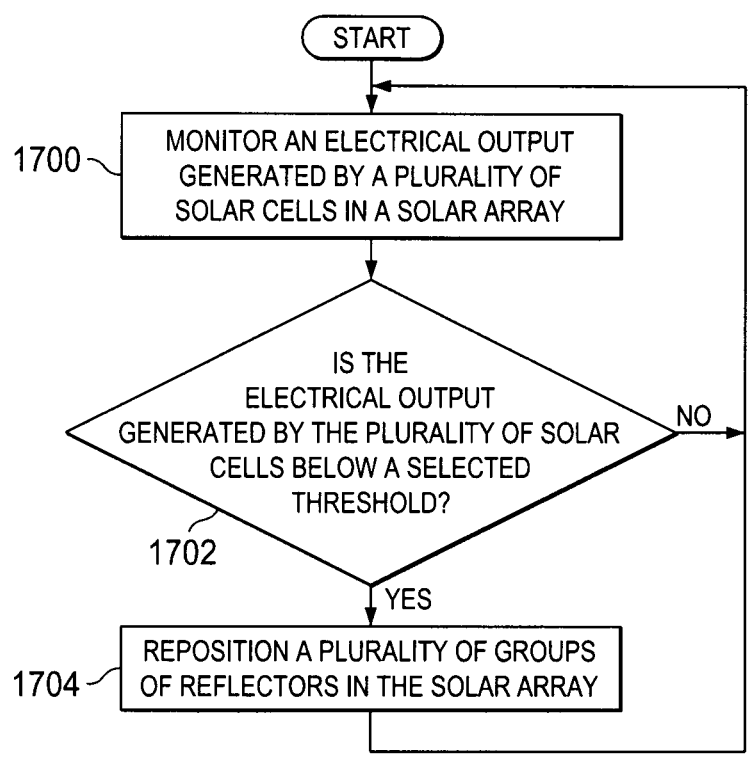
FIG. 17 is an illustration of a process for focusing light onto a plurality of solar cells in the form of a flowchart in accordance with an illustrative example.

With reference now to FIG. 17, an illustration of a process for focusing light onto a plurality of solar cells is depicted in the form of a flowchart in accordance with an illustrative example. The process illustrated in FIG. 17 may be used to, for example, focus a beam of light onto a plurality of solar cells, such as plurality of solar cells 606 in FIG. 6.

The process may begin by monitoring an electrical output generated by a plurality of solar cells in a solar array (operation 1700). Next, a determination may be made as to whether the electrical output generated by the plurality of solar cells is below a selected threshold (operation 1702). If the electrical output generated by the plurality of solar cells is below the selected threshold, a plurality of groups of reflectors in the solar array are repositioned (operation 1704), with the process then returning to operation 1700 as described above. Otherwise, if the electrical output generated by the plurality of solar cells is not below the selected threshold, the process returns to operation 1700 as described above.

Figure 18:
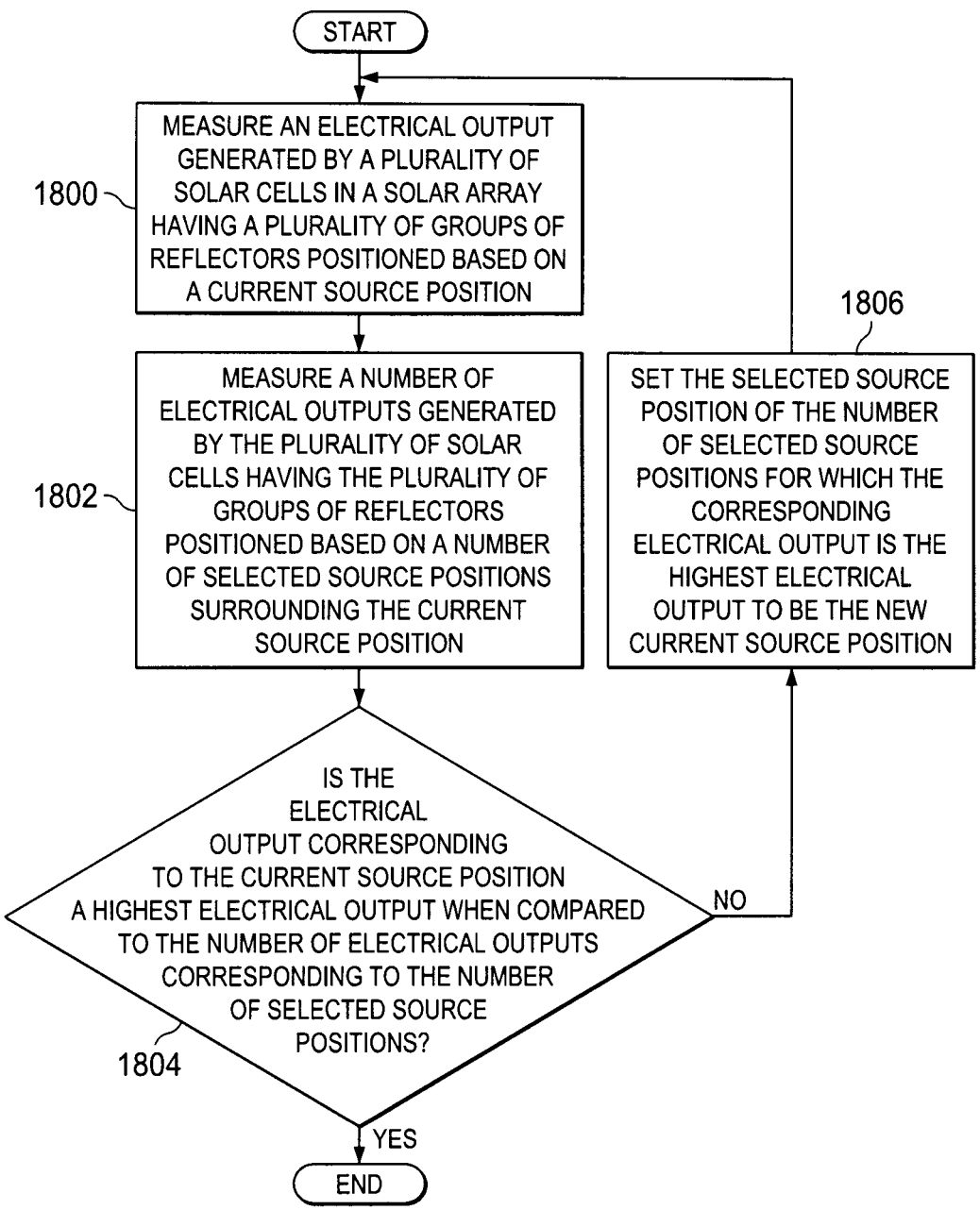
FIG. 18 is an illustration of a process for focusing light onto a solar cell in the form of a flowchart in accordance with an illustrative example.

With reference now to FIG. 18, an illustration of a process for focusing light onto a solar cell is depicted in the form of a flowchart in accordance with an illustrative example. The process illustrated in FIG. 18 may be used to, for example, focus a beam of light onto a plurality of solar cells, such as plurality of solar cells 606 in FIG. 6.

The process may begin by measuring an electrical output generated by a plurality of solar cells in a solar array having a plurality of groups of reflectors positioned based on a current source position (operation 1800). In operation 1800, the current source position may be defined as $(\theta_{focus}, \phi_{focus})$. In this manner, the current source position may be an angular position with respect to an axis that is substantially perpendicular to the solar array. Each reflector in each group of reflectors in the plurality of groups of reflectors may be positioned to reflect a beam of light being directed from this current source position to the solar cell of the plurality of solar cells corresponding to that reflector.

Next, a number of electrical outputs generated by the plurality of solar cells having the plurality of groups of reflectors positioned based on a number of selected source positions surrounding the current source position are measured (operation 1802). In operation 1802, the plurality of groups of reflectors may be repositioned based on a particular one of the number of selected source positions. The electrical output generated by the plurality of solar cells with the plurality of groups of reflectors being positioned based on this particular selected source position is measured. This process may be repeated for each of the number of selected source positions.

The number of selected source positions may include, for example, 8 positions. These 8 positions may include the following positions: $(\theta_{focus}+\Delta\theta, \phi_{focus}+\Delta\phi)$, $(\theta_{focus}+\Delta\theta, \phi_{focus}-\Delta\phi)$, $(\theta_{focus}-\Delta\theta, \phi_{focus}+\Delta\phi)$, $(\theta_{focus}-\Delta\theta, \phi_{focus}\,\Delta\phi)$, $(\theta_{focus}, \phi_{focus}+\Delta\phi)$, $(\theta_{focus}, \phi_{focus}-\Delta\phi)$, $(\theta_{focus}+\Delta\theta, \phi_{focus})$, and $(\theta_{focus}-\Delta\theta, \phi_{focus})$. In other examples, some other number of selected source positions may be selected. For example, 4, 7, 9, 15, 20, or some other number of positions may be selected.

Thereafter, a determination is made as to whether the electrical output corresponding to the current source position is a highest electrical output when compared to the number of electrical outputs corresponding to the number of selected source positions (operation 1804). In particular, in operation 1804, the determination is made as to whether the electrical output corresponding to the current source position or the electrical output corresponding to one of the number of selected source positions is a highest electrical output.

If the electrical output corresponding to the current source position is the highest electrical output, the process terminates. Otherwise, the selected source position of the number of selected source positions for which the corresponding electrical output is the highest electrical output is set to be the new current source position (operation 1806), with the process then returning to operation 1800 as described above.

The process described in FIG. 18 may be performed repeatedly, continuously, or periodically. For example, the process described in FIG. 18 may be set to repeat at the lapse of a timer or in response to the occurrence of some event.

Figure 19:
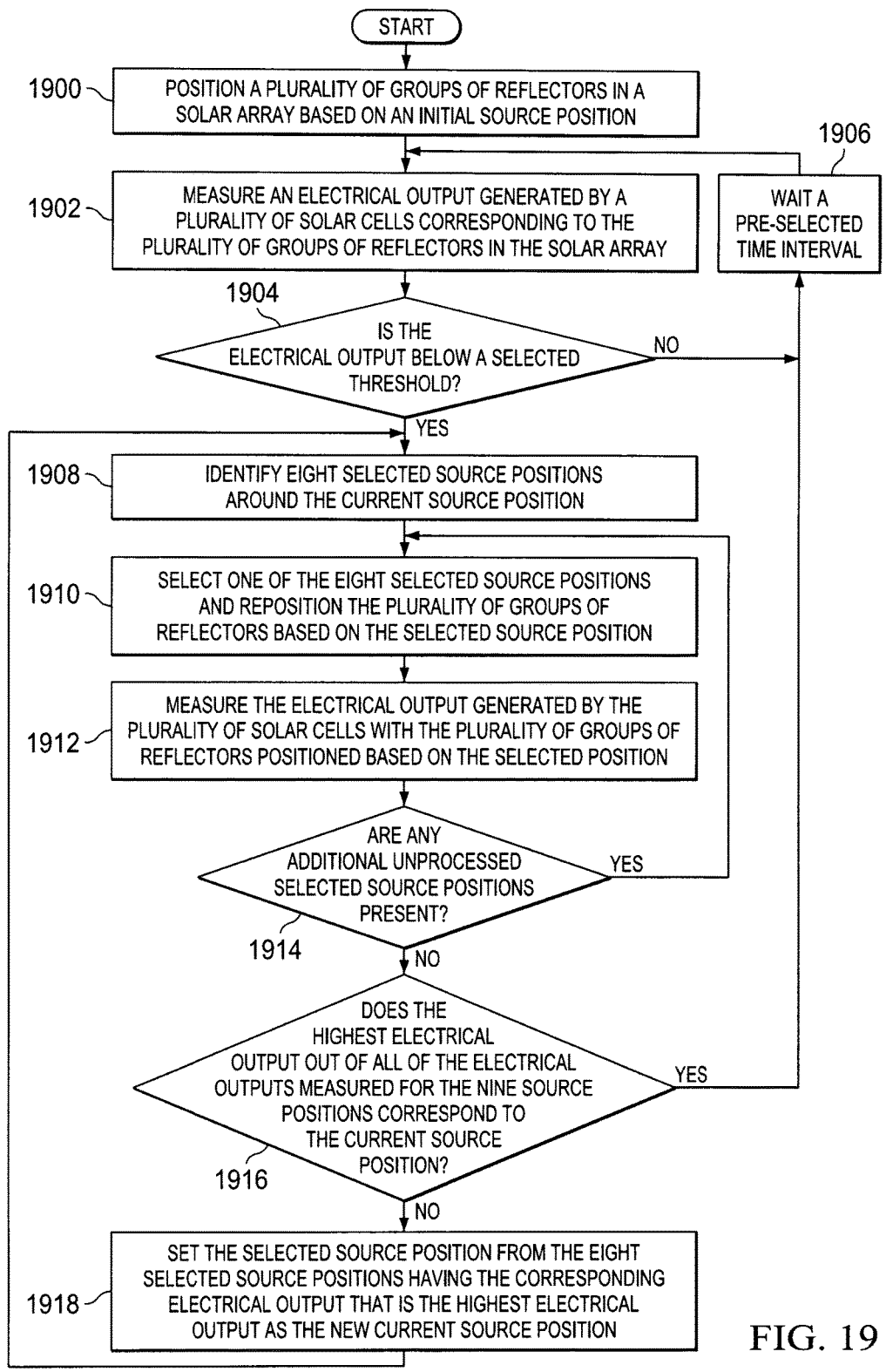
FIG. 19 is an illustration of a process for tracking sunlight using a solar array in the form of a flowchart in accordance with an illustrative example.

With reference now to FIG. 19, an illustration of a process for tracking sunlight using a solar array is depicted in the form of a flowchart in accordance with an illustrative example. The process illustrated in FIG. 19 may be implemented to track sunlight using, for example, solar array 604 in FIG. 6. A similar process may be used to track sunlight using a set of solar arrays, such as set of solar arrays 602 in FIG. 6.

The process may begin by positioning a plurality of groups of reflectors in a solar array based on an initial source position (operation 1900). The initial source position, (e, (I)) may be, for example, (0, 0). The initial source position may be the angular position relative to an axis substantially perpendicular to the solar array at which the sun is thought to be positioned. Positioning the plurality of groups of reflectors in operation 1900 may include applying a voltage to the actuation device corresponding to each reflector in the plurality of groups of reflectors such that each reflector is tilted in a manner that enables the highest concentration of light to be focused onto a corresponding solar cell in a plurality of solar cells in the solar array given the assumption that the source of the light is actually at the initial source position.

Next, an electrical output generated by a plurality of solar cells corresponding to the plurality of groups of reflectors in the solar array is measured (operation 1902). A determination is made as to whether the electrical output is below a selected threshold (operation 1904). If the electrical output is not below the selected threshold, the process waits a pre-selected time interval (operation 1906), with the process then returning to operation 1902 as described above.

With reference again to operation 1904, if the electrical output is below the selected threshold, eight selected source positions around the current source position are identified (operation 1908). In one illustrative example, the eight selected source positions may be 1 degree offsets from the current source position (θ, φ). For example, the eight selected source positions may be (θ−1°, φ−1°), (θ+1°, φ−1°), (θ+1°, φ+1°), (θ+1°, φ+1°), (θ, φ−1°), (θ, φ+1°), (θ−1°, φ), and (θ+1°, φ).

Thereafter, one of the eight selected source positions is selected and the plurality of groups of reflectors is repositioned based on the selected source position (operation 1910). Next, the electrical output generated by the plurality of solar cells is measured with the plurality of groups of reflectors positioned based on the selected source position (operation 1912). The process then determines whether any additional unprocessed selected source positions are present (operation 1914). If any additional unprocessed selected source positions are present, the process returns to operation 1910. Otherwise, the process determines whether the highest electrical output out of all the electrical outputs measured for the nine source positions corresponds to the current source position (operation 1916). The nine source positions include the eight selected source positions and the current source position.

If the highest electrical output out of all of the electrical outputs measured for the nine source positions corresponds to the current source position, the process proceeds to operation 1906 as described above. Otherwise, the selected source position from the eight selected source positions having the corresponding electrical output that is the highest electrical output is set as the new current source position (operation 1918), with the process then returning to operation 1908 as described above.

Figure 20:
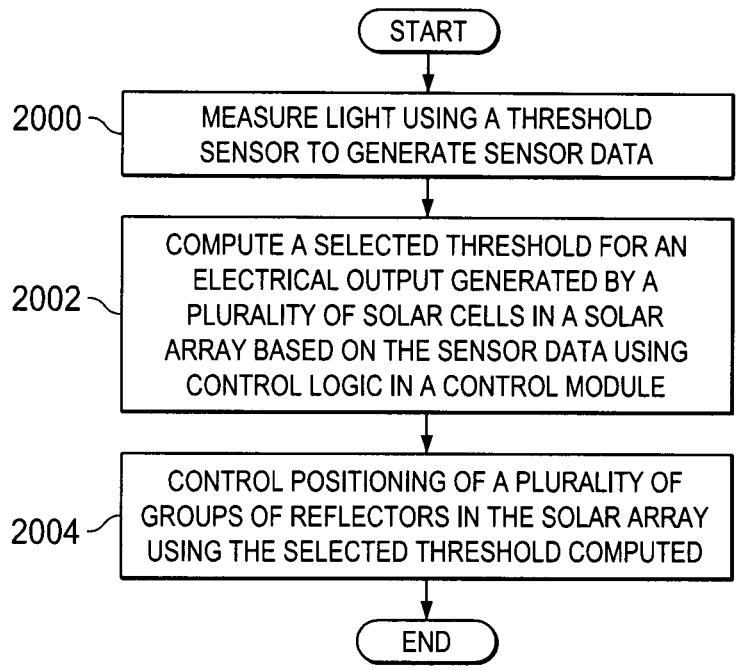
FIG. 20 is an illustration of a process for managing a solar array in the form of a flowchart in accordance with an illustrative example.

With reference now to FIG. 20, an illustration of a process for managing a solar array is depicted in the form of a flowchart in accordance with an illustrative example. The process illustrated in FIG. 20 may be implemented to manage solar array 604 in FIG. 6.

The process may begin by measuring light using a threshold sensor to generate sensor data (operation 2000). In one illustrative example, the threshold sensor may take the form of a threshold solar cell. In some illustrative examples, the sensor data may be generated by more than one threshold sensor. The sensor data may include measurements of intensity, current, voltage, power, some other parameter that can be correlated with the intensity of the light, or some combination thereof.

Then, a selected threshold is computed for an electrical output generated by a plurality of solar cells in a solar array based on the sensor data using control logic in a control module (operation 2002). Thereafter, positioning of a plurality of groups of reflectors in the solar array is controlled using the selected threshold computed (operation 2004), with the process terminating thereafter.

Figure 21:
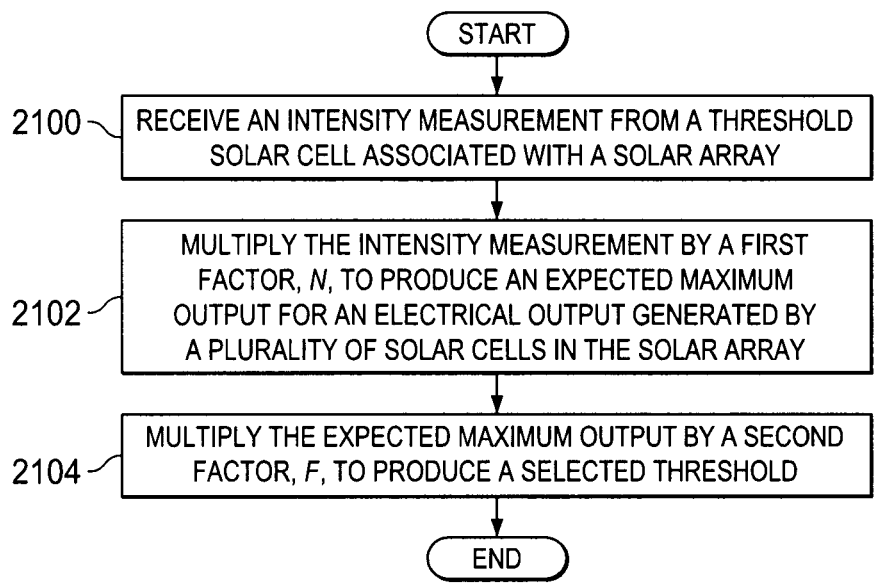
FIG. 21 is an illustration of a process for computing a selected threshold for a solar array in the form of a flowchart in accordance with an illustrative example.

With reference now to FIG. 21, an illustration of a process for computing a selected threshold for an electrical output of a solar array is depicted in the form of a flowchart in accordance with an illustrative example. The process illustrated in FIG. 21 may be implemented to manage solar array 604 in FIG. 6. This process may be used to dynamically set, for example, without limitation, selected threshold 624 for electrical output 622 generated by solar array 604 in FIG. 6.

The process may begin by receiving an intensity measurement from a threshold solar cell associated with a solar array (operation 2100). The intensity measurement in operation 2100 may be a measurement of the intensity of light around the solar array.

The threshold solar cell may be mounted to a coverglass of a solar array, a substrate of a solar array, or some other component of a solar array. The threshold solar cell may be positioned with respect to the various components of the solar array to ensure that a desired amount of light reaches the threshold solar cell based on the position of the light source.

Next, the intensity measurement is multiplied by a first factor, n, to produce an expected maximum output for an electrical output generated by a plurality of solar cells in the solar array (operation 2102). The expected maximum output is then multiplied by a second factor, f, to produce a selected threshold (operation 2104), with the process terminating thereafter.

The selected threshold computed in operation 2104 may be set such that any drop in the electrical output generated by the plurality of solar cells in the solar array below the selected threshold triggers a refocusing of the solar array. In other words, at least one reflector in the solar array may be repositioned with respect to at least one axis to refocus the light onto the plurality of solar cells.

This process may be repeated any number of times during the operation of the solar array to ensure that the selected threshold being used to trigger refocusing of the reflectors in the solar array takes into account the light. This type of dynamic setting of the selected threshold may improve overall performance of the solar array.

Although the selected threshold is described as being computed using two factors in FIG. 21, any number of scale factors, algorithms, mathematical formulas, equations, or combination thereof may be used to compute the selected threshold in other illustrative examples. Further, the factors used to compute the selected threshold may be selected based on the level of performance desired for the solar array.

Figure 22:
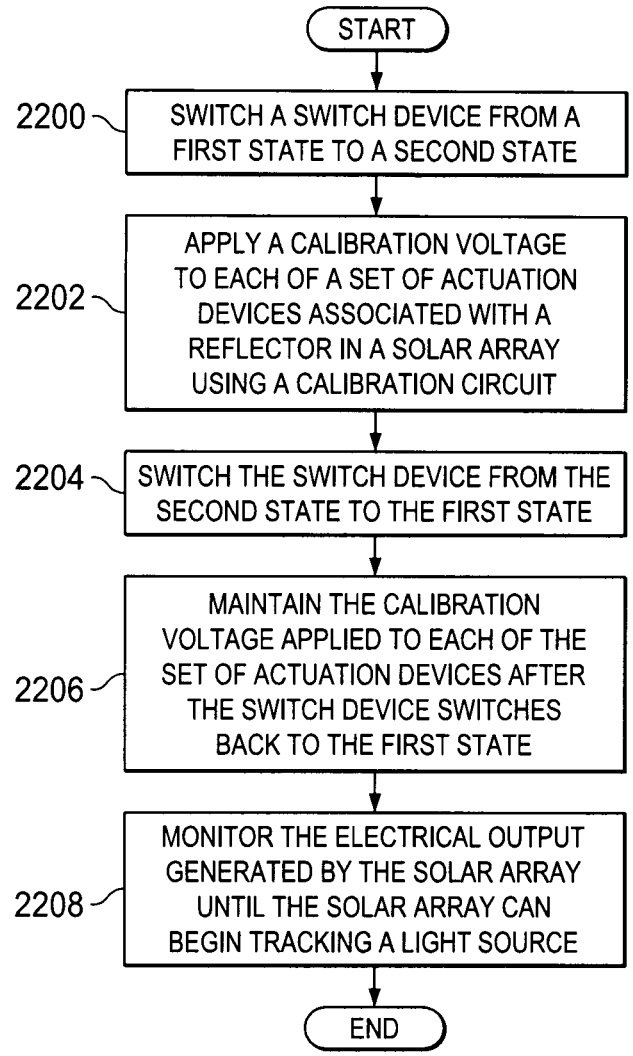
FIG. 22 is an illustration of a process for calibrating a reflector in the form of a flowchart in accordance with an illustrative example.

With reference now to FIG. 22, an illustration of a process for calibrating a reflector is depicted in the form of a flowchart in accordance with an illustrative example. The process illustrated in FIG. 22 may be implemented to calibrate a reflector, such as reflector 704 in FIG. 7, using a calibration system, such as calibration system 700 in FIG. 7.

The process begins by switching a switch device from a first state to a second state (operation 2200). A calibration voltage is applied to each of a set of actuation devices associated with a reflector in a solar array using a calibration circuit in response to the switch device switching to the second state when the calibration circuit is electrically connected to the set of actuation devices (operation 2202). In operation 2202, applying the calibration voltage to each of the set of actuation devices positions the reflector in a calibrated position, which may be angled relative to the substrate with which the reflector is coupled.

The switch device switches from the second state to the first state in response to an event occurring (operation 2204). In operation 2204, the event may be, for example, event 735 described in FIG. 7. The event may include the occurrence of at least one of the lapse of a preselected period of time or timer, receiving an electrical signal, or the voltage being applied to each of the set of actuation devices reaching the calibration voltage.

The calibration voltage applied to each of the set of actuation devices is maintained after the switch device switches back to the first state (operation 2206). The electrical output generated by the solar array is monitored until the solar array can begin tracking a light source (operation 2208), with the process terminating thereafter.

Figure 23B:
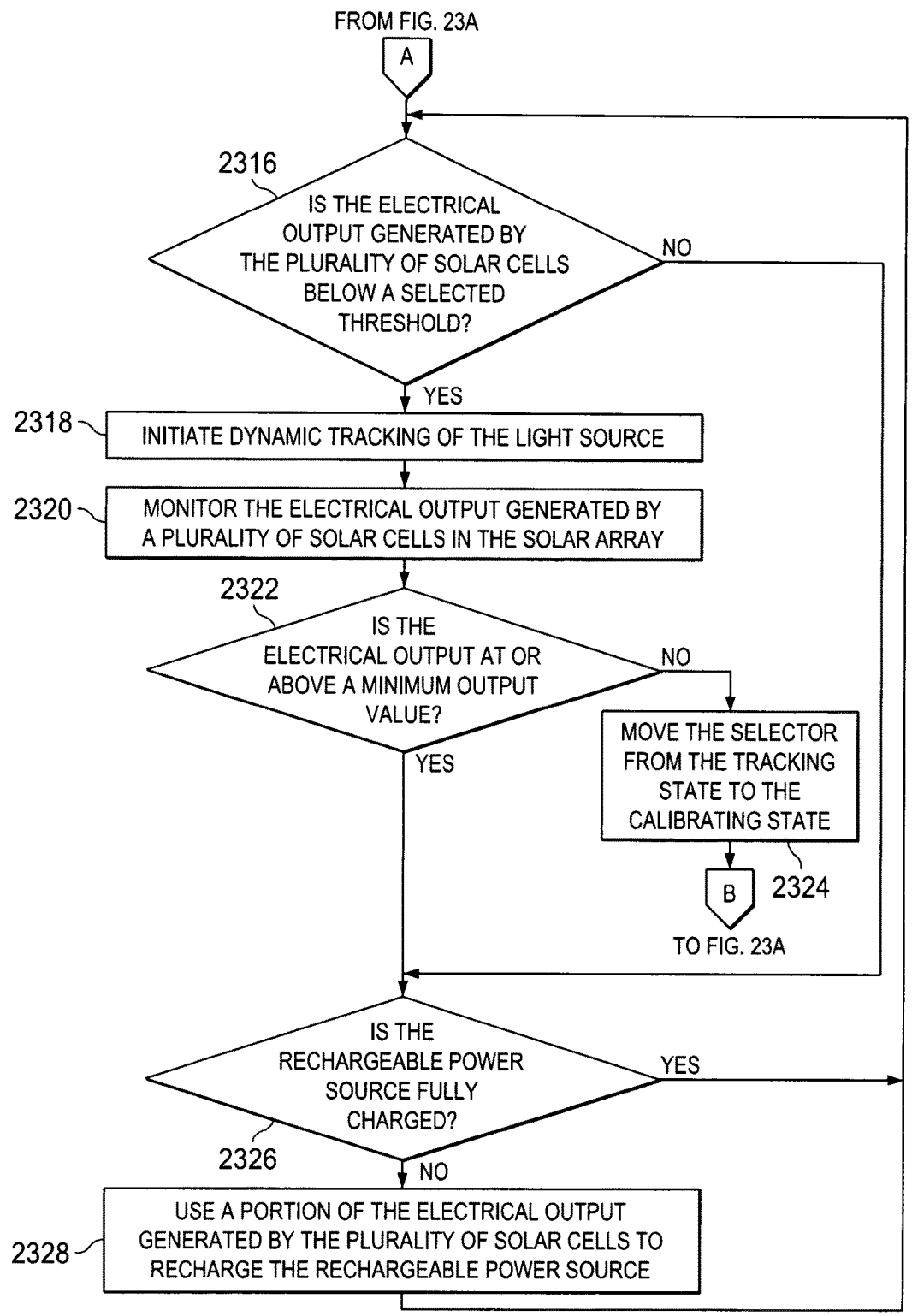

With reference now to FIGS. 23A and 23B, illustrations of a process for calibrating and managing a solar array are depicted in the form of a flowchart in accordance with an illustrative example. The process described in FIGS. 23A and 23B may be used to calibrate and manage a solar array, such as solar array 604 in FIG. 6. The process described in FIGS. 23A and 23B begins with the voltage being applied to each of the actuation devices in the solar array being substantially zero.

In particular, the process begins by waiting for a switch device in a calibration circuit to be switched from a first state to a second state (operation 2300). Once the switch device has been switched from the first state to the second state, power is sent from a rechargeable power source in the calibration circuit to actuation devices in a solar array and capacitors in the calibration circuit are charged using the rechargeable power source until an event occurs (operation 2302).

In operation 2302, the event may be the lapse of a preselected period of time or timer. The preselected period of time may be the time needed to increase the voltages being applied to the actuation devices to calibration voltages and to charge the capacitors such that the calibration voltages can be maintained. In operation 2302, the calibration voltage may be the same or different event for the different actuation devices. Applying the corresponding calibration voltage to each of the actuation devices moves the corresponding reflectors in the solar array into calibrated positions.

In response to the event occurring, the switch device is switched from the second state to the first state (operation 2304). The capacitors discharge, while maintaining the calibration voltage applied to each of the actuation devices (operation 2306). In operation 2306, resistors in the calibration circuit help maintain the calibration voltage that is applied to each of the actuation devices.

The electrical output generated by a plurality of solar cells in the solar array is monitored (operation 2308). A determination is made as to whether the electrical output is at or above a minimum output value (operation 2310). If the electrical output is not at or above the minimum output value, a determination is made as to whether the capacitors have been fully discharged (operation 2312).

If the capacitors have not been fully discharged, the process returns to operation 2308 described above. Otherwise, the process returns to operation 2300 described above. With reference again to operation 2310, if the electrical output is at or above a minimum output value, a selector is moved from a calibrating state into a tracking state to electrically connect a voltage manager to the actuation devices (operation 2314).

A determination is made as to whether the electrical output generated by the plurality of solar cells is below a selected threshold (operation 2316). If the electrical output is below the selected threshold, the process initiates dynamic tracking of the light source (operation 2318). Operation 2318 may be performed in a manner similar to the process that includes performing, for example, without limitation, operations 1906, 1908, 1910, 1912, 1914, 1916, and 1918 in FIG. 19.

The electrical output generated by a plurality of solar cells in the solar array is monitored (operation 2320). A determination is made as to whether the electrical output is at or above a minimum output value (operation 2322). If the electrical output is not at or above a minimum output value, the selector is moved from the tracking state to the calibrating state (operation 2324), with the process then returning to operation 2300 described above.

Otherwise, if the electrical output is at or above a minimum output value, a determination is made as to whether the rechargeable power source is fully charged (operation 2326). If the rechargeable power source is fully charged, the process returns to operation 2316 described above. Otherwise, a portion of the electrical output generated by the plurality of solar cells is used to recharge the rechargeable power source (operation 2328), with the process then returning to operation 2316 described above. With reference again to operation 2316, if the electrical output generated by the plurality of solar cells is not below the selected threshold, the process proceeds to operation 2326 described above.

The flowcharts and block diagrams in the different depicted examples illustrate the architecture, functionality, and operation of some possible implementations of apparatuses and methods in an illustrative example. In this regard, each block in the flowcharts or block diagrams may represent a module, a segment, a function, a portion of an operation or step, some combination thereof.

In some alternative implementations of an illustrative example, the function or functions noted in the blocks may occur out of the order noted in the figures. For example, in some cases, two blocks shown in succession may be executed substantially concurrently, or the blocks may sometimes be performed in the reverse order, depending upon the functionality involved. Also, other blocks may be added in addition to the illustrated blocks in a flowchart or block diagram.

Thus, the illustrative examples provide a method and apparatus for managing a solar array. Light may be measured using one or more threshold sensors to generate sensor data. A selected threshold may be computed for an electrical output generated by a plurality of solar cells in the solar array based on the sensor data using control logic in a control module. Positioning of a plurality of groups of reflectors in the solar array is controlled using the selected threshold computed.

By computing the selected threshold based on the sensor data, changes in the position of the light source, in the environment around the solar array, or both may be taken into account to ensure that the selected threshold is properly set. If the selected threshold is set too low, then the focused light on the plurality of solar cells in the solar array may eventually wander off the plurality of solar cells to the point that the solar array may be unable to generate the desired amount of power. Conversely, if the selected threshold is set too high, then the solar array may be unable to reach a focused state and may just turn off.

Thus, using a set of threshold sensors to ensure that the amount of light expected to be detected corresponds with the amount of light that is actually available for detection may improve the overall performance of the solar array. Dynamically setting the selected threshold with the capability to adjust the selected threshold over time based on changing conditions may improve the ability of the solar array to dynamically track a light source over time in these changing conditions.

The description of the different illustrative examples has been presented for purposes of illustration and description, and is not intended to be exhaustive or limited to the examples in the form disclosed. Many modifications and variations will be apparent to those of ordinary skill in the art. Further, different illustrative examples may provide different features as compared to other desirable examples. The example or examples selected are chosen and described in order to best explain the principles of the examples, the practical application, and to enable others of ordinary skill in the art to understand the disclosure for various examples with various modifications as are suited to the particular use contemplated.

What is claimed is:

1. An apparatus comprising:
a plurality of actuation devices connected to a corresponding plurality of reflectors in a solar array, the plurality of actuation devices configured to change corresponding angles of the corresponding plurality of reflectors relative to a single focusing lens that focuses light from the plurality of reflectors onto a single solar cell, the single solar cell behind the single focusing lens relative to the plurality of reflectors; and
a calibration circuit comprising:
a power source independent of the single solar cell;
a plurality of capacitors connected to the power source;
a plurality of resistors connected to the plurality of capacitors and to the power source, and configured to control a charging rate and discharging rate of the plurality of capacitors;
a switch device operable to switch between a first state and a second state, wherein switching the switch device from the first state to the second state causes the calibration circuit to apply a calibration voltage from the power source to each of the plurality of actuation devices when the calibration circuit is electrically connected to the plurality of actuation devices, and wherein switching the switch device from the second state to the first state causes the calibration circuit to disconnect the calibration voltage from each of the plurality of actuation devices;
a selector having a tracking state and a calibrating state, wherein the selector electrically connects the calibration circuit to the plurality of actuation devices when the selector is in the calibrating state, and wherein selector electrically disconnects the calibration circuit from the plurality of actuation devices when the selector is in the tracking state; and
a voltage manager electrically connected to the single solar cell and to the plurality of actuation devices, the voltage manager configured to send at least a portion of electrical output from the single solar cell to the plurality of actuation devices when the selector is in the tracking state, but to electrically disconnect the single solar cell from the plurality of actuation devices when the selector is in the calibration state.

2. The apparatus of claim 1, wherein the calibration circuit maintains the calibration voltage applied to each actuation device of plurality set of actuation devices after the switch device switches from the second state to the first state.

3. The apparatus of claim 1, wherein
each of the plurality of capacitors charges while the switch device is in the second state and discharges after the switch device switches from the second state to the first state.

4. The apparatus of claim 3, wherein the power source charges the set of capacitors.

5. The apparatus of claim 4, wherein the power source is a rechargeable power source.

6. The apparatus of claim 5, wherein the rechargeable power source is selected from one of a rechargeable battery, a capacitor bank, and an inductor bank.

7. The apparatus of claim 1, wherein the selector is moved from the tracking state to the calibrating state when an electrical output of the solar array drops below a minimum output value.

8. The apparatus of claim 1, wherein the plurality of reflectors are micro-electromechanical systems based reflectors.

9. The apparatus of claim 1, wherein applying the calibration voltage to each of the plurality of actuation devices positions the reflector in a calibrated position.

10. The apparatus of claim 9 further comprising:
a substrate, wherein the plurality of reflectors are coupled to the substrate and wherein the calibrated position for the plurality of reflectors is rotationally offset with respect to at least one axis relative to a plane of the substrate.

11. A method for calibrating a solar array using a calibration circuit including a power source independent of the solar array, a plurality of capacitors connected to the power source, a plurality of resistors connected to the plurality of capacitors and to the power source and configured to control a charging rate and discharging rate of the plurality of capacitors, wherein the solar array includes a plurality of actuators connected to corresponding ones of a plurality of reflectors, the plurality of actuators configured to change angles of the plurality of reflectors with respect to a single solar cell in the solar array, and wherein the calibration circuit further includes a switch device electrically connected to the power source and to the plurality of reflectors, the method comprising:
applying a calibration voltage from the power source to each of the plurality of actuation devices in response to the switch device switching to the second state when the calibration circuit is electrically connected to the plurality of actuation devices;
removing the calibration voltage from the power source to each of the plurality of actuation devices in response to the switch device switching to the first state when the calibration circuit is electrically connected to the plurality of actuation devices;
connecting, using a selector, the calibration circuit to the plurality of actuation devices when the selector is in a calibrating state;
disconnecting, using the selector, the calibration circuit from the plurality of actuation devices when the selector is in a tracking state; and
sending, using a voltage manager, at least a portion of electrical output from the single solar cell to the plurality of actuation devices when the selector is in the tracking state, but electrically disconnecting the single solar cell from the plurality of actuation devices when the selector is in the calibration state.

12. The method of claim 11 further comprising:
maintaining the calibration voltage applied to each actuation device after the switch device switches from the second state to the first state.

13. The method of claim 12 further comprising:
switching the switch device from the second state to the first state in response to an event occurring, wherein the event is selected from one of a lapse of a preselected period of time and receiving an electrical signal.

14. The method of claim 11, further comprising:
maintaining the calibration voltage at each actuation device using the plurality of capacitors and the plurality of resistors in the calibration circuit after the switch device switches from the second state to the first state.

15. The method of claim 11 further comprising:

moving the selector from the tracking state to the calibrating state to electrically connect the calibration circuit to the plurality of actuation devices, wherein when the calibration circuit is not connected to the calibration circuit the plurality of actuators are powered by electrical energy taken from the solar cell instead of from the power source.

* * * * *

UNITED STATES PATENT AND TRADEMARK OFFICE
CERTIFICATE OF CORRECTION

PATENT NO. : 10,236,822 B2
APPLICATION NO. : 14/656259
DATED : March 19, 2019
INVENTOR(S) : Singer et al.

Page 1 of 1

It is certified that error appears in the above-identified patent and that said Letters Patent is hereby corrected as shown below:

In the Claims
Claim 11, paragraph 2, Line 3, herein change "the second state" to read -a second state-
Claim 11, paragraph 3, Line 3, herein change "the first state" to read -a first state- Signed and Sealed this
Twenty-eighth Day of May, 2019

Andrei Iancu
*Director of the United States Patent and Trademark Office*